(12) United States Patent
Yamada

(10) Patent No.: US 7,122,838 B2
(45) Date of Patent: Oct. 17, 2006

(54) SOLID-STATE IMAGING DEVICE

(75) Inventor: Tohru Yamada, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 301 days.

(21) Appl. No.: 10/804,807

(22) Filed: Mar. 19, 2004

(65) Prior Publication Data

US 2004/0195577 A1  Oct. 7, 2004

(30) Foreign Application Priority Data

Mar. 31, 2003  (JP)  ............................. 2003-095926

(51) Int. Cl.
*H01L 33/00*  (2006.01)
(52) U.S. Cl. ................... 257/79; 21/E31.124
(58) Field of Classification Search ............... 257/79
See application file for complete search history.

(56) References Cited

U.S. PATENT DOCUMENTS

| | | | |
|---|---|---|---|
| 6,107,124 A | 8/2000 | Park et al. | |
| 6,268,234 B1 * | 7/2001 | Yoshida | 438/60 |
| 6,326,655 B1 * | 12/2001 | Suzuki | 257/239 |
| 6,541,805 B1 * | 4/2003 | Suzuki | 257/232 |

FOREIGN PATENT DOCUMENTS

| | | |
|---|---|---|
| JP | 5-6993 | 1/1993 |
| JP | 7-74344 | 3/1995 |
| JP | 7-226497 | 8/1995 |
| JP | 9-326483 | 12/1997 |
| JP | 11-234571 | 8/1999 |
| KR | 1999-11896 | 2/1999 |

* cited by examiner

*Primary Examiner*—Roy Potter
(74) *Attorney, Agent, or Firm*—Hamre, Schumann, Mueller & Larson, P.C.

(57) ABSTRACT

A solid-state imaging device is provided, in which both a reduction in a read voltage and enhancement of a transfer efficiency are satisfied. A p type well 507 is formed on an n type semiconductor substrate 506, and a CCD channel region 102 is formed on a surface region of the p type well 507. A gate insulating film 510 is formed on a surface of the CCD channel region 102, and first electric charge transfer electrodes 503 are formed on the gate insulating film 510. An interlayer insulating film 511 is formed on circumferences of the first electric charge transfer electrodes, and second electric charge transfer electrodes 504 are formed between the first electric charge transfer electrodes on the gate insulating film 510. An electrode length L1 of the second electric charge transfer electrodes 504 is longer than an electrode length L2 of the first electric charge transfer electrodes 503, and n⁻ type potential level difference regions 113 are formed in upstream side portions of the CCD channel region under the second electric charge transfer electrodes 504 by p type impurity implantation.

8 Claims, 17 Drawing Sheets

SOLID-STATE IMAGING DEVICE

BACKGROUND OF THE INVENTION

1. Field of the Invention

The present invention relates to a solid-state imaging device. In particular, the present invention relates to a solid-state imaging device, such as an interline transfer type solid-state imaging device, configured in such a manner that signal charge generated and accumulated in a photoelectric converting region is read via a charge-coupled device (CCD).

2. Description of the Related Art

Recently, a household video camera and digital camera using a solid-state imaging device is used widely. In these cameras, an interline transfer type solid-state imaging device is widely used, which reads signal charge generated and accumulated in a photoelectric converting region via a CCD. In such an interline transfer type solid-state imaging device, in order to reduce power consumption and allow a power source to be shared by the solid-state imaging device and a liquid crystal monitor mounted thereon, an attempt has been made to reduce a read voltage.

As an attempt to reduce a read voltage, a solid-state imaging device has been proposed in which, among a plurality of electric charge transfer electrodes constituting a vertical CCD, an electric charge transfer electrode that also functions as a reading gate for transmitting a signal charge generated and accumulated in a photoelectric converting region to the vertical CCD is configured so as to have an electrode length in a transfer direction longer than that of the other electric charge transfer electrodes (e.g., see JP 2950317). Hereinafter, a conventional interline transfer type solid-state imaging device with a reduced read voltage will be described.

FIG. 17 is a view schematically showing an overall configuration of a conventional interline transfer type solid-state imaging device. In FIG. 17, reference numeral 100 denotes a photodiode (PD) for performing photoelectric conversion. 200 denotes a vertical CCD for transferring signal charge in a vertical direction. 300 denotes a signal charge read portion for reading signal charge from the photodiode 100 to the vertical CCD 200. 400 denotes a horizontal CCD for transferring signal charge in a horizontal direction. 500 denotes an output portion for detecting and amplifying signal charge. Generally, a region "I" composed of the photodiode 100 for performing photoelectric conversion and the vertical CCD 200 is called a pixel.

The operation of the solid-state imaging device thus configured is performed schematically as follows. Each photodiode 100 generates and accumulates signal charge in accordance with the amount of incident light by photoelectric conversion. During a vertical blanking period after the elapse of a predetermined accumulation period, the signal charge accumulated in the photodiode 100 is read collectively to the adjacent vertical CCD 200 via the signal charge read portion 300. Then, the signal charge is transferred downward in FIG. 17 through a plurality of vertical CCDs 200 in parallel on a stage basis, and the signal charge is transferred from the final transfer stage of each vertical CCD 200 to the horizontal CCD 400 on a row basis. Then, the signal charge is transferred successively leftward in FIG. 17 through the horizontal CCD 400. The signal charge is converted to a voltage signal in the output portion 500, and thereafter, is output as a video signal in a temporal series.

FIG. 18A is a plan view showing a pixel configuration in the region "I" shown in FIG. 17. FIG. 18B is a cross-sectional view taken along a line II–II' shown in FIG. 18A. In FIG. 18A or 18B, reference numeral 501 denotes a photoelectric converting region formed of an n type diffusion layer. 502 denotes a CCD channel region of the vertical CCD 200 formed of an n type diffusion layer. 503 denotes a first electric charge transfer electrode of the vertical CCD 200 formed of a first polysilicon layer. 504 denotes a second electric charge transfer electrode of the vertical CCD 200 formed of a second polysilicon layer. 505 denotes an electric charge read portion of the second electric charge transfer region 504, for reading electric charge from the photoelectric converting region 501. 506 denotes an n type semiconductor substrate. 507 denotes a p type well. 508 denotes a p type reading region for reading signal charge accumulated in the photoelectric converting region 501 to the CCD channel region 502. 509 denotes a p$^+$ type device separation region for separating the photoelectric converting regions 501 and the CCD channel regions 502 from each other. 510 denotes a gate insulating film. 511 denotes an interlayer insulating film for insulating the first electric charge transfer electrode 503 from the second electric charge transfer electrode 504. In FIG. 18B, ΦV1, ΦV2, ΦV3, and ΦV4 denote transfer clocks.

The signal charge generated and accumulated in the photoelectric converting region 501 by photoelectric conversion is read to the CCD channel region 502 through the p type reading region 508 by applying a read pulse having a voltage amplitude of, for example, 8 to 15 V to the second electric charge transfer electrode 504. Thereafter, by applying a transfer pulse having a voltage amplitude of, for example, −5 to −8 V to the first electric charge transfer electrode 503 and the second electric charge transfer electrode 504, the signal charge is transferred from right to left in FIG. 18B through the CCD channel region 502. The impurity concentration in the p type reading region 508 is set to be an appropriate value in such a manner as follows: when a read pulse is applied to the second electric charge transfer electrode 504, the p type reading region 508 is conductive and completely transfers the signal charge in the photoelectric converting region 501 to the CCD channel region 502, and when a transfer pulse is applied to the first electric charge transfer electrode 503 and the second electric charge transfer electrode 504, and the signal charge is transferred through the CCD channel region 502, the p type reading region 508 is kept in a non-conducting state.

In order to read the electric charge accumulated in the photoelectric converting region 501 to the CCD channel region 502, it is required that the amplitude of a voltage to be applied to the second electric charge transfer electrode 504 is 15 V or less due to the constraint of a driving circuit. Herein, when a width W (FIG. 18A) of the electric charge read portion 505 of the second electric charge transfer electrode 504 is narrow, which is defined by the device separation region 509 and the first electric charge transfer electrode 503, the p type reading region 508 is unlikely to be conducted due to a narrow channel effect to increase a read voltage.

In order to solve the above-mentioned problem, in a conventional solid-state imaging device, the width W of the electric charge read portion 505 is enlarged to such a degree that a narrow channel effect does not occur remarkably. More specifically, as shown in FIG. 18B, the electric charge read portion 505 is formed so that an electrode length L1 of the second electric charge transfer electrode 504 that also functions as a reading gate is set to be longer than an electrode length L2 of the first electric charge transfer electrode 503.

In general, the transfer efficiency of a CCD is determined mainly by a fringe electric field generated between transfer electrodes. In particular, the transfer efficiency largely depends upon a minimum electric field under a transfer electrode. As the minimum electric field becomes larger, a time (transfer time) required for transfer becomes shorter, whereby the transfer efficiency is enhanced.

FIG. 19A is a cross-sectional view partially showing the vertical CCD shown in FIG. 18B. FIG. 19B shows a potential distribution in the channel region at an intermediate voltage while the vertical CCD is driven with four-phase transfer clocks of ΦV1, ΦV2, ΦV3, and ΦV4, whereby the first electric charge transfer electrode 503 supplied with ΦV2 changes from a middle level voltage $V_{VM}$ to a low level voltage $V_{VL}$. FIG. 19C shows a potential distribution in the channel region at an intermediate voltage while the second electric charge transfer electrode 504 supplied with ΦV1 changes from the middle level voltage $V_{VM}$ to the low level voltage $V_{VL}$. In FIGS. 19B and 19C, a potential is shown with the downward direction being positive.

As shown in FIG. 19A, in the conventional solid-state imaging device, in order to reduce a read voltage, the electrode length L1 of the second electric charge transfer electrode 504 is set to be longer than the electrode length L2 of the first electric charge transfer electrode 503. Therefore, a minimum electric potential 512 under the second electric charge transfer electrode 504 supplied with ΦV1 appears at the center portion of the second electric charge transfer electrode 504 whose electrode length is formed long, as shown in FIG. 19C, and its value is decreased as the electrode length L1 is longer.

Thus, in the conventional solid-state imaging device, as the electrode length L1 of the second electric charge transfer electrode 504 is increased so as to reduce a read voltage, the minimum electric field becomes weak, decreasing the transfer efficiency.

SUMMARY OF THE INVENTION

Therefore, with the foregoing in mind, it is an object of the present invention to provide a solid-state imaging device, in which even if an electrode length of an electric charge transfer electrode is set to be longer so as to reduce a read voltage, a transfer efficiency is enhanced by increasing a minimum electric field under the electric charge transfer electrode, whereby both a reduction in a read voltage and enhancement of a transfer efficiency are satisfied.

In order to achieve the above-mentioned object, a solid-state imaging device of the present invention includes: a plurality of second conductivity photoelectric converting regions formed on a surface region of a first conductivity semiconductor substrate or a first conductivity well; a second conductivity CCD channel region provided adjacent to the photoelectric converting regions; a first conductivity electric charge reading region provided between the photoelectric converting region and the CCD channel region; a first conductivity device separation region provided on circumferences of the photoelectric converting regions excluding the reading region; a plurality of first electric charge transfer electrodes provided on the CCD channel region; and second electric charge transfer electrodes provided between the plurality of first electric charge transfer electrodes. The second electric charge transfer electrodes have an electrode length in an electric charge transfer direction longer than that of the first electric charge transfer electrodes, and function as an electric charge reading gate for reading electric charge from the photoelectric converting regions, and in the CCD channel region under the second electric charge transfer electrodes, a potential gradient deepening in the electric charge transfer direction is provided.

These and other advantages of the present invention will become apparent to those skilled in the art upon reading and understanding the following detailed description with reference to the accompanying figures.

DESCRIPTION OF THE PREFERRED EMBODIMENTS

Figure 17:
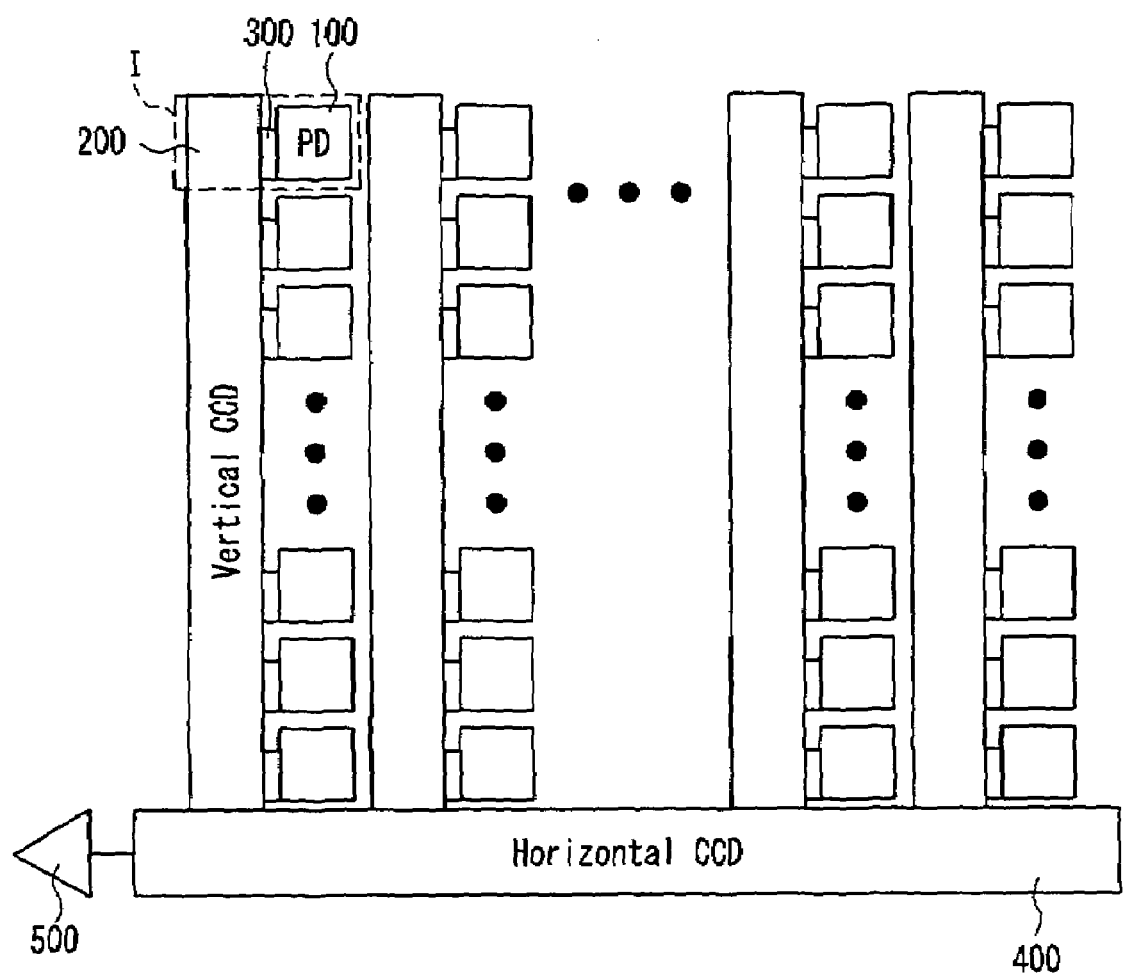
FIG. 17 is a view schematically showing an entire configuration of a conventional interline transfer type solid-state imaging device.

Hereinafter, the present invention will be described by way of preferred embodiments with reference to the drawings. In each of the following embodiments, the overall configuration, read of signal charge, and a transfer operation of an interline transfer type solid-state imaging device are the same as those in the conventional example described with reference to FIG. 17. Each of the following embodiments is different from the conventional example in a portion constituting a pixel, in particular, a configuration of a vertical CCD. Thus, in the following description, the configuration of a vertical CCD and the production method will be described mainly. The components having the same configurations as those in the conventional example are denoted with the same reference numerals as those therein, and the description thereof will be omitted here.

Embodiment 1

Figure 1A:
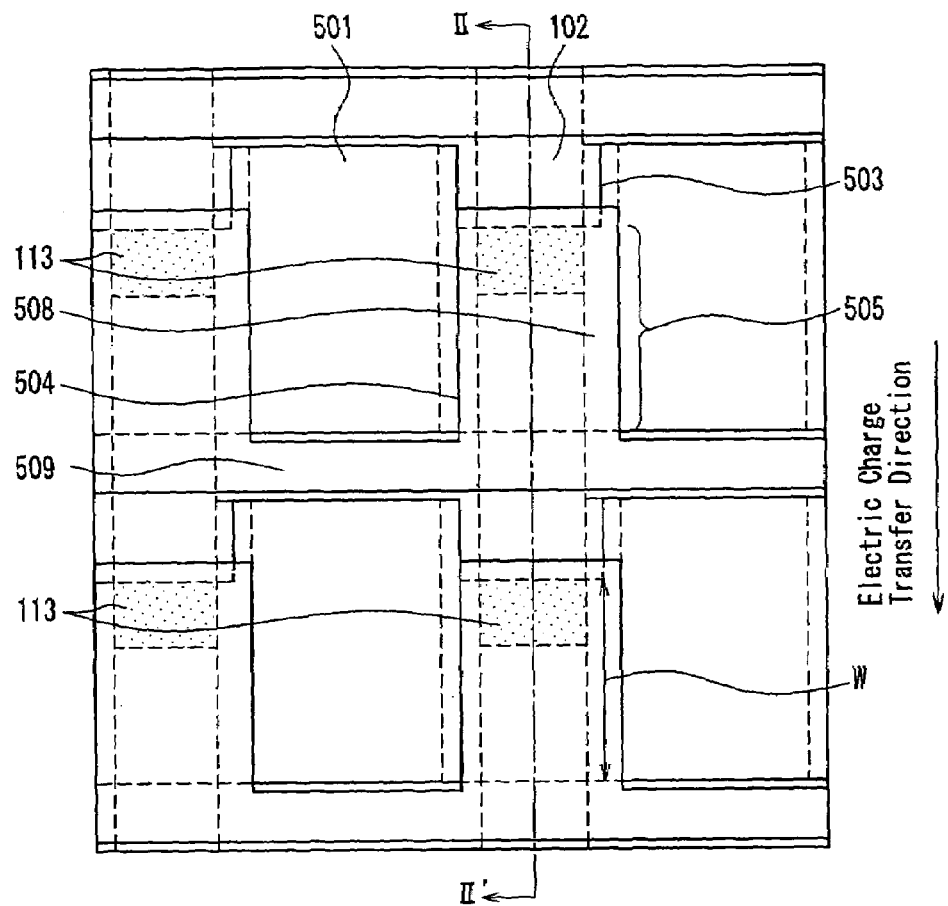
FIG. 1A is a plan view showing a pixel configuration in a solid-state imaging device according to Embodiment 1 of the present invention.
Figure 1B:
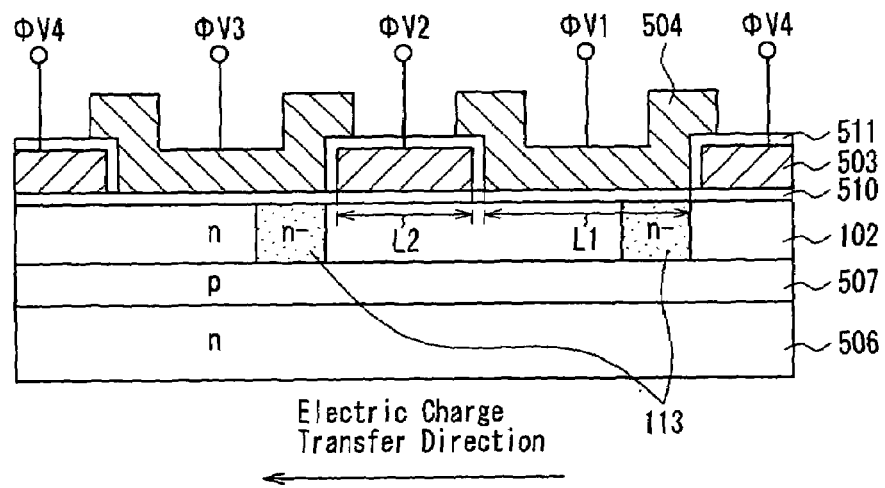
FIG. 1B is a cross-sectional view taken along a line II–II' shown in FIG. 1A.

FIG. 1A is a plan view showing a pixel configuration in a solid-state imaging device according to Embodiment 1 of the present invention. FIG. 1B is a cross-sectional view taken along a line II–II' shown in FIG. 1A.

Figure 18A:
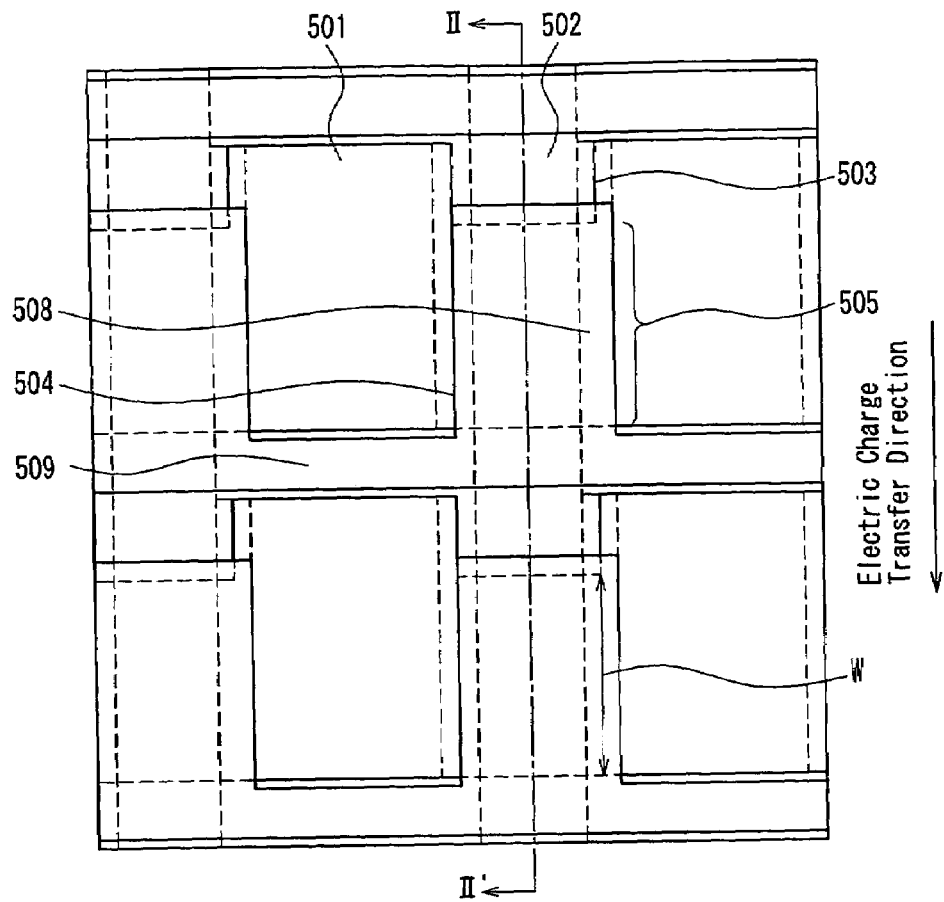
FIG. 18A is a plan view showing a pixel configuration in the conventional solid-state imaging device.
Figure 18B:
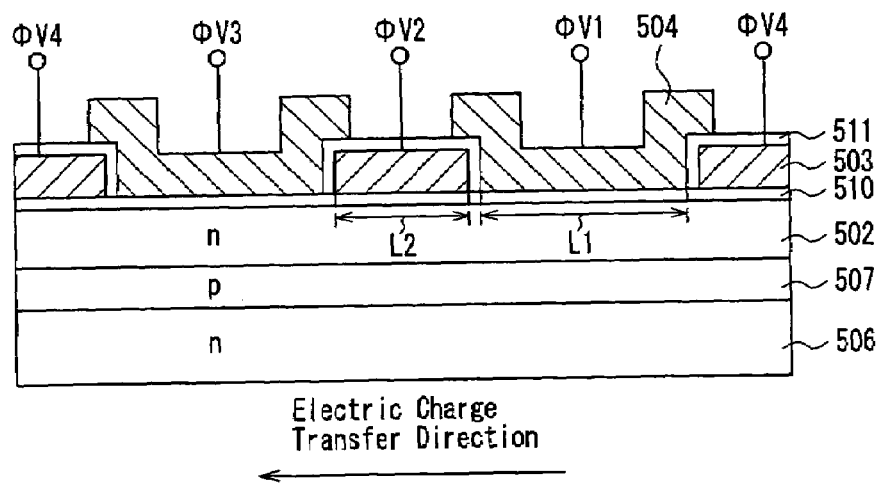
FIG. 18B is a cross-sectional view taken along a line II–II' shown in FIG. 18A.
Figure 19A:
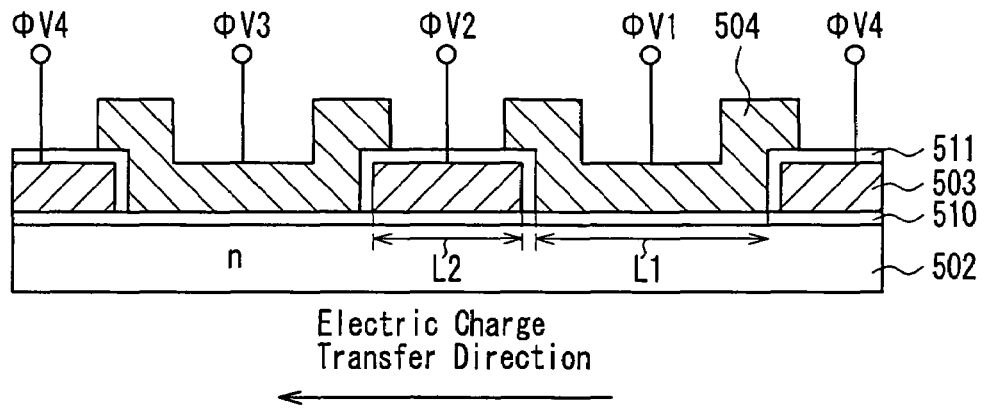
FIG. 19A is a cross-sectional view partially showing a vertical CCD shown in FIG. 18B.
Figure 19B:
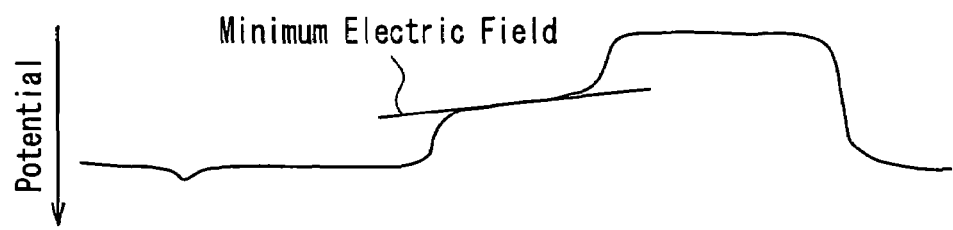
FIG. 19B shows a potential distribution in a channel region at an intermediate voltage while the vertical CCD shown in FIG. 19A is driven with four-phase transfer clocks of ΦV1, ΦV2, ΦV3, and ΦV4, whereby a first electric charge transfer electrode 503 supplied with ΦV2 changes from a middle level voltage $V_{VM}$ to a low level voltage $V_{VL}$.
Figure 19C:
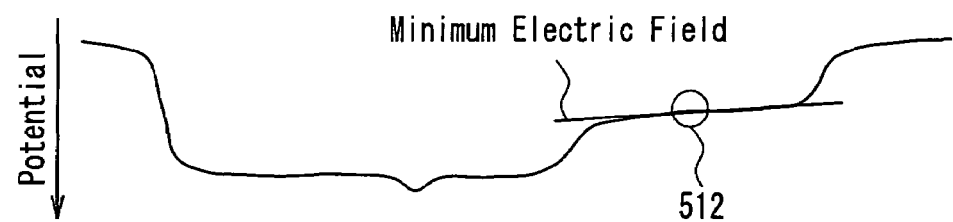
FIG. 19C shows a potential distribution in a channel region at an intermediate voltage while the vertical CCD shown in FIG. 19A is driven with four-phase transfer clocks of ΦV1, ΦV2, ΦV3, and ΦV4, whereby a second electric charge transfer electrode 504 supplied with ΦV1 changes from a middle level voltage $V_{VM}$ to a low level voltage $V_{VL}$.

In FIGS. 1A and 1B, Embodiment 1 is different from the conventional example shown in FIGS. 18A and 18B in that n⁻ type potential level difference regions 113 for forming a potential gradient are provided on an upstream side in an electric charge transfer direction of a CCD channel region 102 under second electric charge transfer electrodes 504.

Figure 2A:
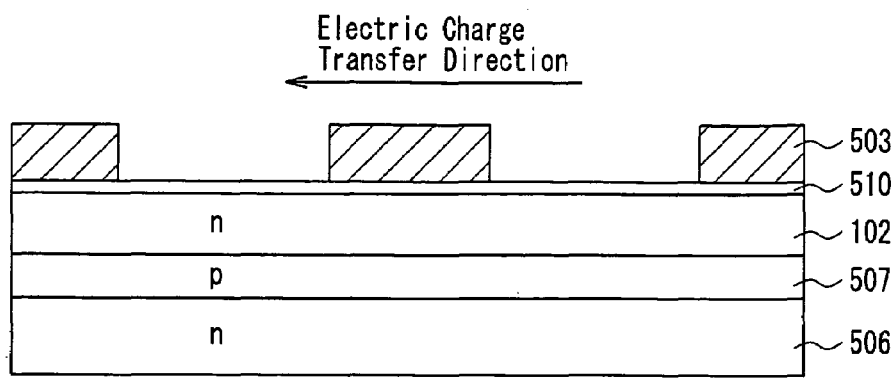
FIG. 2A is a cross-sectional view in one step of producing a vertical CCD shown by the cross-sectional view in FIG. 1B.
Figure 2B:
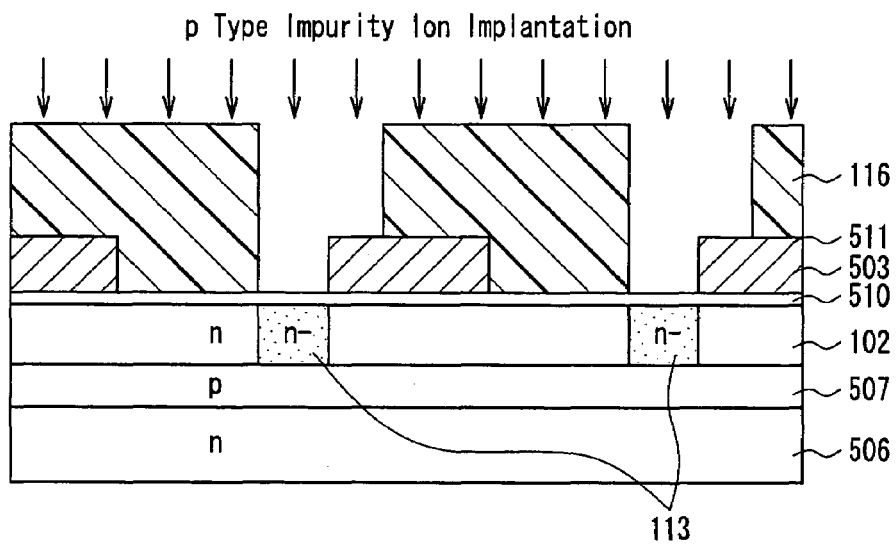
FIG. 2B is a cross-sectional view in one step of producing the vertical CCD shown by the cross-sectional view in FIG. 1B.
Figure 2C:
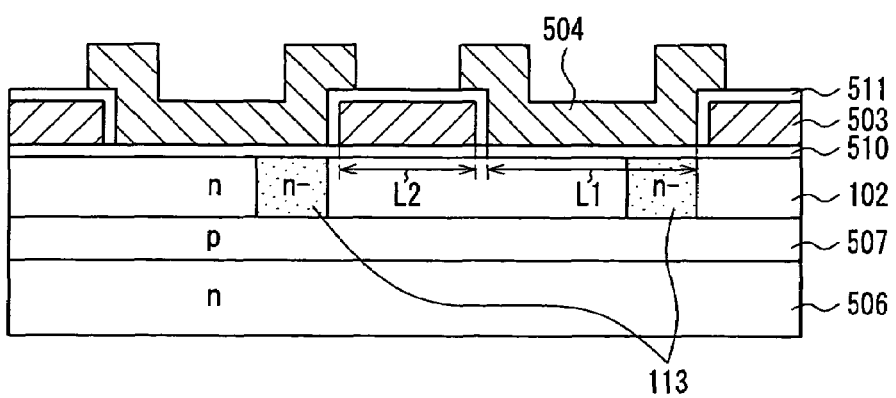
FIG. 2C is a cross-sectional view in one step of producing the vertical CCD shown by the cross-sectional view in FIG. 1B.

Next, a method for producing such a solid-state imaging device will be described with reference to FIGS. 2A, 2B, and 2C. FIGS. 2A to 2C are cross-sectional views in each production step for the vertical CCD shown by the cross-sectional view in FIG. 1B.

First, as shown in FIG. 2A, a p type well 507 is formed by implanting a p type impurity into an n type semiconductor substrate 506. A CCD channel region 102 is formed by implanting an n type impurity into a surface region of the p type well 507. A gate insulating film 510 is formed by growing a thermal oxide film and a chemical vapor deposition (CVD) nitride film on a surface of the CCD channel region 102. First electric charge transfer electrodes 503 are provided by forming a first polysilicon layer on the gate insulating film 510, and removing portions of the first polysilicon layer by patterning.

Next, as shown in FIG. 2B, a photoresist 116 having openings on an upstream side in an electric charge transfer direction of the first electric charge transfer electrodes 503 is formed. Using the photoresist 116 and the first electric charge transfer electrodes 503 as a mask, a p type impurity such as boron is implanted in a self-alignment manner, whereby the n⁻ type potential level difference regions 113 are formed.

Next, as shown in FIG. 2C, the photoresist 116 is removed, and thereafter, the circumferences of the first electric charge transfer electrodes 503 are thermally oxidized to form an interlayer insulating film 511. Then, second electric charge transfer electrodes 504 composed of a second polysilicon layer are formed between the first electric charge transfer electrodes 503 on the gate insulating film 510, whereby a solid-state imaging device according to Embodiment 1 is produced.

Next, the advantages of the solid-state imaging device thus produced will be described with reference to FIGS. 3A, 3B, and 3C.

Figure 3A:
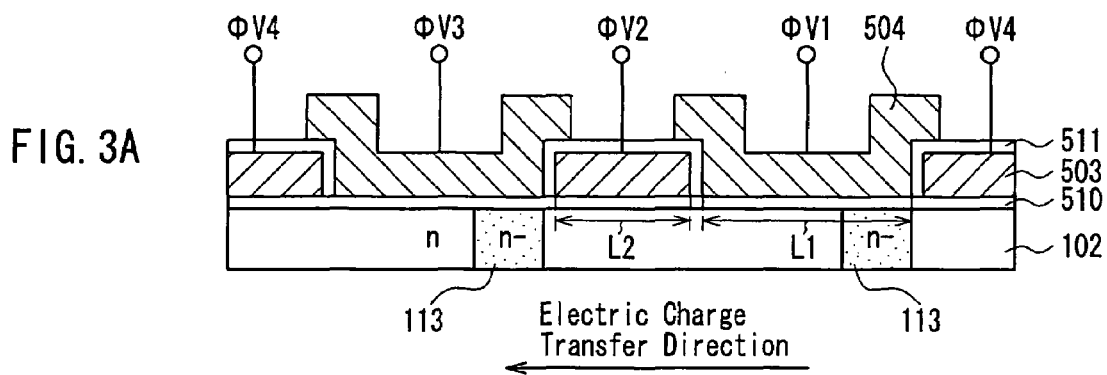
FIG. 3A is a cross-sectional view partially showing the vertical CCD shown in FIG. 1B or 2C.
Figure 3B:
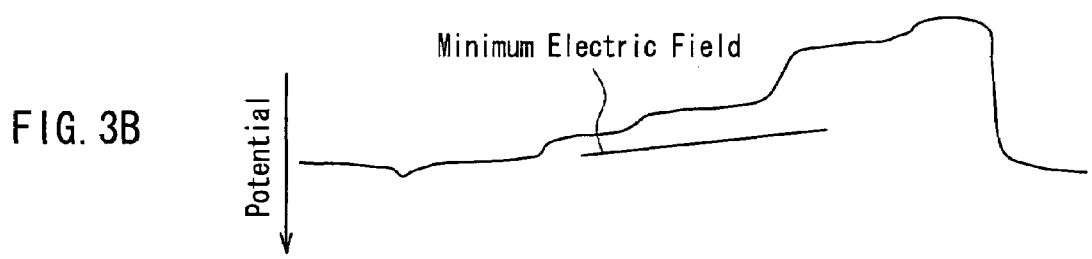
FIG. 3B shows a potential distribution in a channel region at an intermediate voltage while the vertical CCD shown in FIG. 3A is driven with four-phase transfer clocks of ΦV1, ΦV2, ΦV3, and ΦV4, whereby a first electric charge transfer electrode 503 supplied with ΦV2 changes from a middle level voltage $V_{VM}$ to a low level voltage $V_{VL}$.

FIG. 3A is a cross-sectional view partially showing the vertical CCD shown in FIG. 1B or 2C. FIG. 3B shows a potential distribution in a channel region at an intermediate voltage while the vertical CCD shown in FIG. 3A is driven with four-phase transfer clocks of ΦV1, ΦV2, ΦV3, and ΦV4, whereby the first electric charge transfer electrode 503 supplied with ΦV2 changes from a middle level voltage $V_{VM}$ to a low level voltage $V_{VL}$. FIG. 3C shows a potential distribution in a channel region at an intermediate voltage while the second electric charge transfer electrode 504 supplied with ΦV1 changes from a middle level voltage $V_{VM}$ to a low level voltage $V_{VL}$. In FIGS. 3B and 3C, a potential is shown with the downward direction being positive.

As described above, generally, the transfer efficiency of a CCD is determined mainly by a fringe electric field generated between transfer electrodes. In particular, the transfer efficiency largely depends upon a minimum electric field under a transfer electrode. As the minimum electric field is larger, a time (transfer time) required for transfer becomes shorter, whereby the transfer efficiency is enhanced.

As shown in FIG. 3A, in the solid-state imaging device according to Embodiment 1, in order to reduce a read voltage, an electrode length L1 of the second electric charge transfer electrode 504 is set to be longer than an electrode length L2 of the first electric charge transfer electrode 503. At the same time, the n⁻ type potential level difference regions 113 for forming a potential gradient are provided in the CCD channel region 102 under the second electric charge transfer electrodes 504.

Figure 3C:
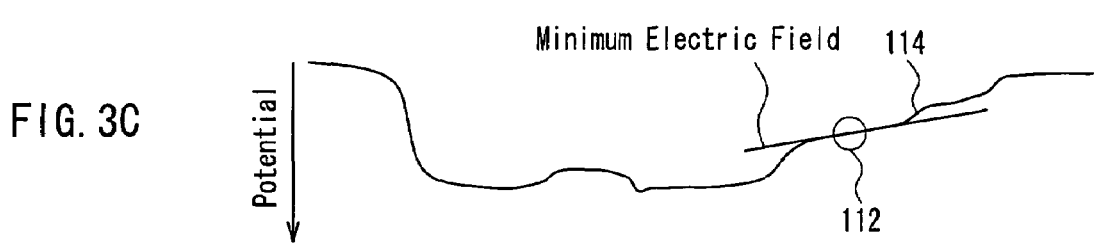
FIG. 3C shows a potential distribution in a channel region at an intermediate voltage while the vertical CCD shown in FIG. 3A is driven with four-phase transfer docks of ΦV1, ΦV2, ΦV3, and ΦV4, whereby a second electric charge transfer electrode 504 supplied with ΦV1 changes from a middle level voltage $V_{VM}$ to a low level voltage $V_{VL}$.

Consequently, as shown in FIG. 3C, under each second electric charge transfer electrode 504, one step of potential level difference 114 is formed by the n⁻ type potential level difference region 113. A minimum electric field 112 under the second electric charge transfer electrode 504 becomes larger than the minimum electric field 512 of the conventional solid-state imaging device.

Thus, in the solid-state imaging device according to Embodiment 1, even if the electrode length L1 of the second electric charge transfer electrode 504 is set to be longer than the electrode length L2 of the first electric charge transfer electrode 503 so as to reduce a read voltage, the minimum electric field 112 under the second electric charge transfer electrode 504 can be increased by forming the n⁻ type potential level difference regions 113 on an upstream side in an electric charge transfer direction of the CCD channel region 102 under the second electric charge transfer electrodes 504. Therefore, both a reduction in a read voltage and enhancement of a transfer efficiency can be satisfied.

Furthermore, in the solid-state imaging device according to Embodiment 1, by forming the n⁻ type potential level difference regions 113 in parts of the CCD channel region 102, the spread of the potential of the n⁻ type potential level difference region 113 is suppressed compared with the conventional solid-state imaging device. This can reduce smear occurring by photoelectric conversion in the regions other than the CCD channel region 102, due to the direct flow of electric charge into the CCD channel region 102, and also can reduce a dark current generated in the n⁻ type potential level difference regions 113.

Furthermore, according to the method for producing a solid-state imaging device according to Embodiment 1, the upstream end in an electric charge transfer direction of the n⁻ type potential level difference region 113 can be formed in a self-alignment manner with respect to the first electric charge transfer electrode 503. Therefore, the n⁻ type potential level difference region 113 does not come under the first electric charge transfer region 503 due to the misalignment of a mask, and a gap is not formed between the upstream end of the n⁻ type potential level difference region 113 and the downstream end of the first electric charge transfer electrode 503 in an electric charge transfer direction. Therefore, a solid-state imaging device with a high transfer efficiency can be produced stably.

Figure 4:
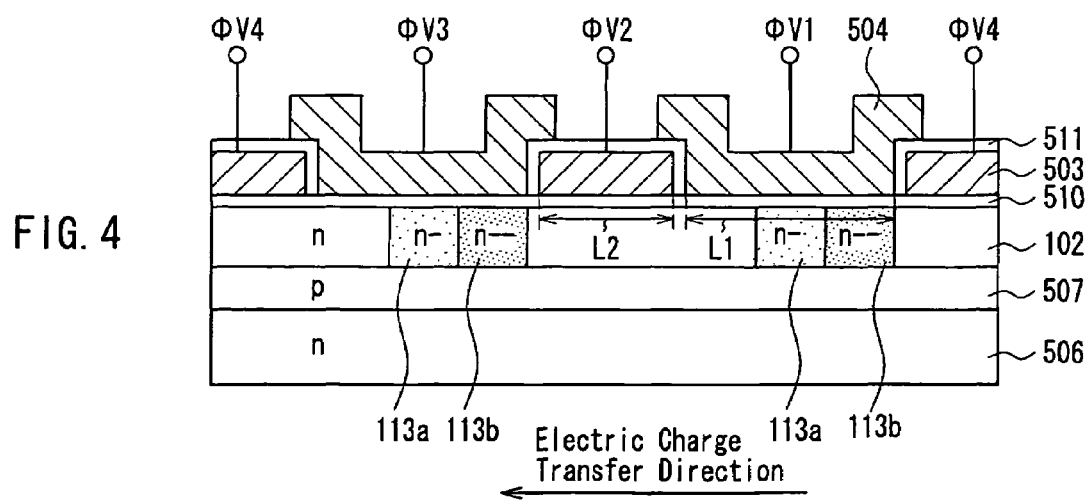
FIG. 4 is a cross-sectional view showing a modified exemplary configuration of a vertical CCD in a solid-state imaging device according to Embodiment 1 of the present invention.

In Embodiment 1, the case where one step of potential level difference is provided by forming one n⁻ type potential level difference region 113 under each second electric charge transfer electrode 504 has been described and illustrated. However, the present invention is not limited thereto. As shown in FIG. 4 as a modified example of Embodiment 1, two or more steps of potential level differences may be formed by a method for forming an n⁻ type potential level difference region 113a and an n⁻ type potential level difference region 113b in the CCD channel region 102 under each second electric charge transfer electrode 504. This further enlarges the minimum electric field under the second electric charge transfer electrode 504. Therefore, the transfer efficiency can be enhanced further.

Embodiment 2

Figure 5A:
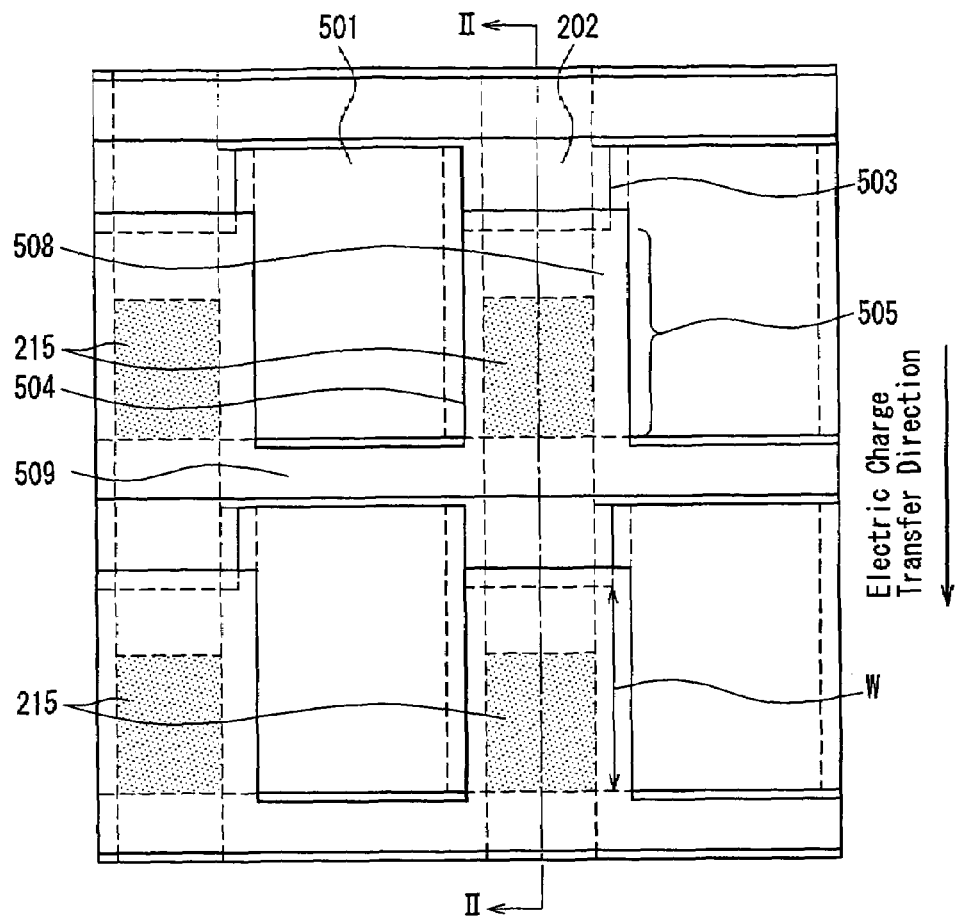
FIG. 5A is a plan view showing a pixel configuration in a solid-state imaging device according to Embodiment 2 of the present invention.
Figure 5B:
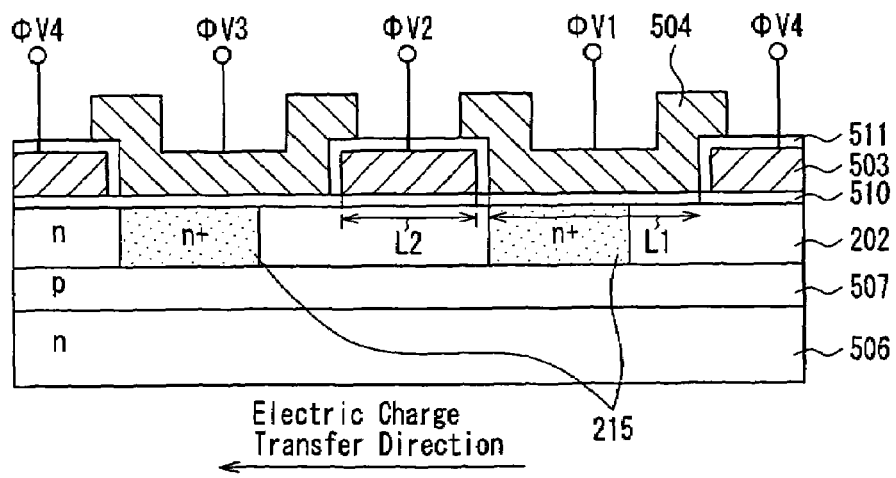
FIG. 5B is a cross-sectional view taken along a line II–II' shown in FIG. 5A.

FIG. 5A is a plan view showing a pixel configuration in a solid-state imaging device according to Embodiment 2 of the present invention. FIG. 5B is a cross-sectional view taken along a line II–II' shown in FIG. 5A.

In FIGS. 5A and 5B, Embodiment 2 is different from Embodiment 1 shown in FIGS. 1A and 1B, in that n⁺ type potential level difference regions 215 for forming a potential gradient are provided on a downstream side in an electric charge transfer direction of the CCD channel region 202 under the second electric charge transfer electrodes 504.

Figure 6A:
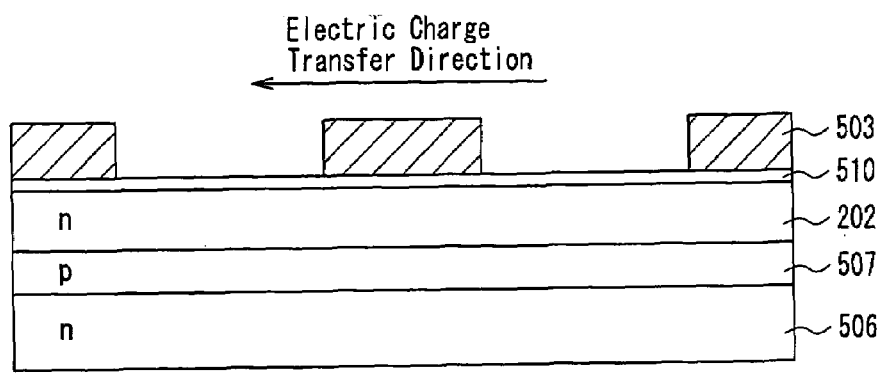
FIG. 6A is a cross-sectional view in one step of producing a vertical CCD shown by the cross-sectional view in FIG. 5B.
Figure 6B:
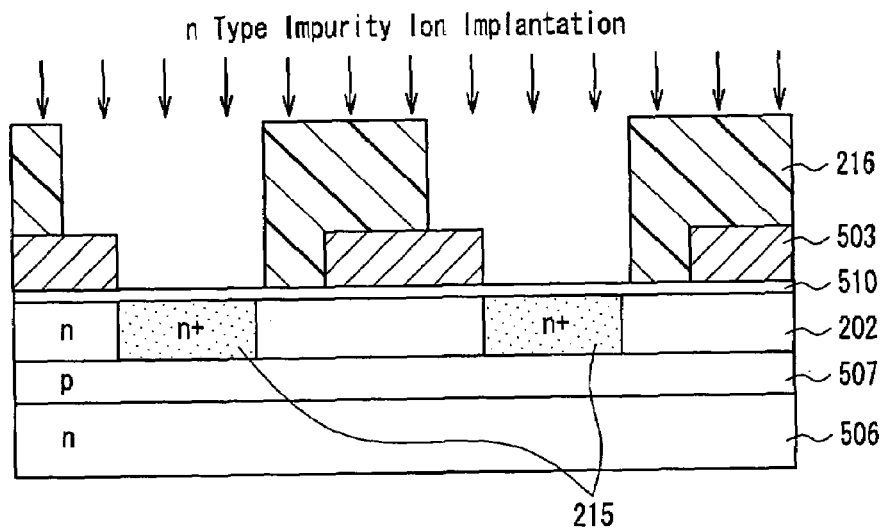
FIG. 6B is a cross-sectional view in one step of producing the vertical CCD shown by the cross-sectional view in FIG. 5B.
Figure 6C:
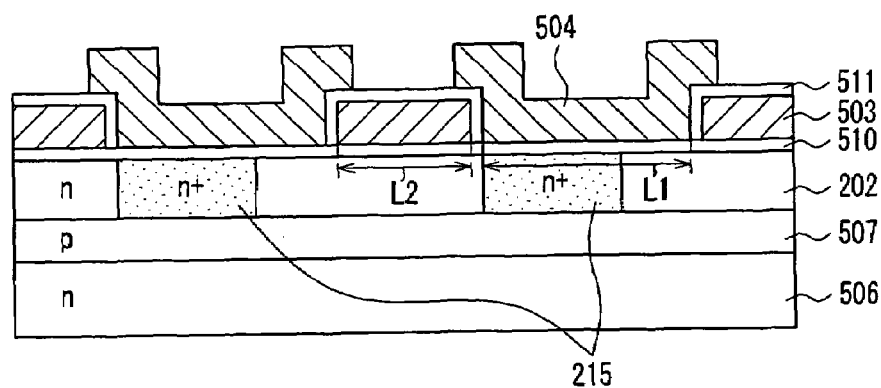
FIG. 6C is a cross-sectional view in one step of producing the vertical CCD shown by the cross-sectional view in FIG. 5B.

Next, a method for producing such a solid-state imaging device will be described with reference to FIGS. 6A, 6B, and 6C. FIGS. 6A to 6C are cross-sectional views in each production step for a vertical CCD shown by the cross-sectional view in FIG. 5B.

First, as shown in FIG. 6A, a p type well 507 is formed by implanting a p type impurity into an n type semiconductor substrate 506. A CCD channel region 202 is formed by implanting an n type impurity into a surface region of the p type well 507. A gate insulating film 510 is formed by growing a thermal oxide film and a CVD nitride film on a surface of the CCD channel region 202. First electric charge transfer electrodes 503 are provided by forming a first polysilicon layer on the gate insulating film 510, and removing the first polysilicon layer by patterning. The process up to here is the same as that of Embodiment 1.

Next, as shown in FIG. 6B, a photoresist 216 having openings on a downstream side in an electric charge transfer direction of the first electric charge transfer electrodes 503 is formed. Using the photoresist 216 and the first electric charge transfer electrodes 503 as a mask, an n type impurity such as boron and arsenic is implanted in a self-alignment manner, whereby an $n^+$ type potential level difference region 215 is formed.

Next, as shown in FIG. 6C, the photoresist 216 is removed, and thereafter, the circumferences of the first electric charge transfer electrodes 503 are thermally oxidized to form an interlayer insulating film 511. Then, second electric charge transfer electrodes 504 composed of a second polysilicon layer are formed between the first electric charge transfer electrodes 503 on the gate insulating film 510, whereby a solid-state imaging device according to Embodiment 2 is produced.

Next, the advantages of the solid-state imaging device thus produced will be described with reference to FIGS. 7A, 7B, and 7C.

Figure 7A:
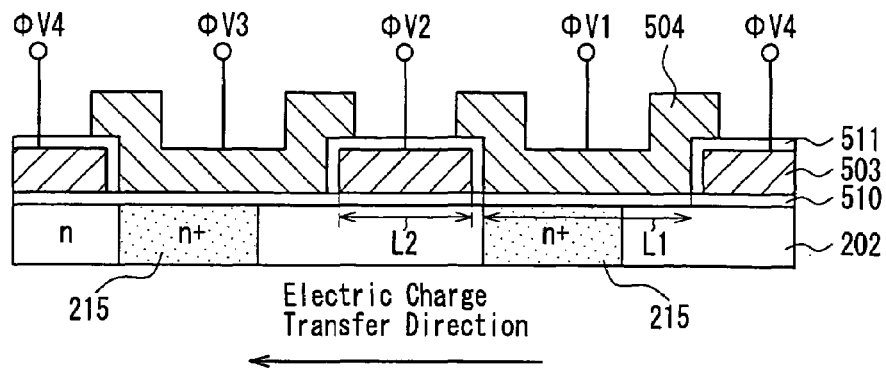
FIG. 7A is a cross-sectional view partially showing the vertical CCD shown in FIG. 5B or 6C.
Figure 7B:
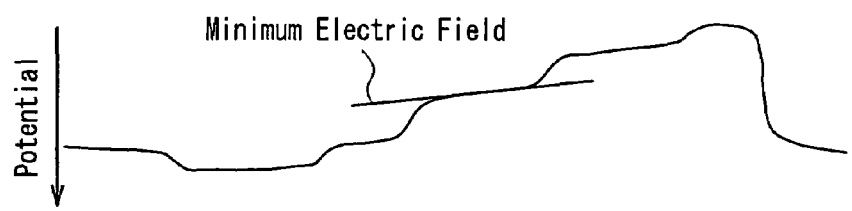
FIG. 7B shows a potential distribution in a channel region at an intermediate voltage while the vertical CCD shown in FIG. 7A is driven with four-phase transfer clocks of ΦV1, ΦV2, ΦV3, and ΦV4, whereby a first electric charge transfer electrode 503 supplied with ΦV2 changes from a middle level voltage $V_{VM}$ to a low level voltage $V_{VL}$.

FIG. 7A is a cross-sectional view partially showing the vertical CCD shown in FIG. 5B or 6C. FIG. 7B shows a potential distribution in a channel region at an intermediate voltage while the vertical CCD shown in FIG. 7A is driven with four-phase transfer docks of $\Phi V1$, $\Phi V2$, $\Phi V3$, and $\Phi V4$, whereby the first electric charge transfer electrode 503 supplied with $\Phi V2$ changes from a middle level voltage $V_{VM}$ to a low level voltage $V_{VL}$. FIG. 7C shows a potential distribution in a channel region at an intermediate voltage while the second electric charge transfer electrode 504 supplied with $\Phi V1$ changes from a middle level voltage $V_{VM}$ to a low level voltage $V_{VL}$. In FIGS. 7B and 7C, a potential is shown with the downward direction being positive.

As described above, generally, the transfer efficiency of a CCD is determined mainly by a fringe electric field generated between transfer electrodes. In particular, the transfer efficiency largely depends upon a minimum electric field under a transfer electrode. As the minimum electric field is larger, a time (transfer time) required for transfer becomes shorter, whereby the transfer efficiency is enhanced.

As shown in FIG. 7A, in the solid-state imaging device according to the present embodiment, in order to reduce a read voltage, an electrode length L1 of the second electric charge transfer electrode 504 is set to be longer than an electrode length L2 of the first electric charge transfer electrode 503. Simultaneously, $n^+$ type potential level difference regions 215 for forming a potential gradient are provided on a downstream side in an electric charge transfer direction of the CCD channel region 202 under the second electric charge transfer electrodes 504.

Figure 7C:
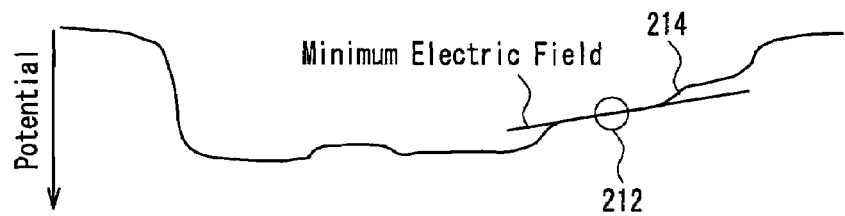
FIG. 7C shows a potential distribution in a channel region at an intermediate voltage while the vertical CCD shown in FIG. 7A is driven with four-phase transfer docks of ΦV1, ΦV2, ΦV3, and ΦV4, whereby a second electric charge transfer electrode 504 supplied with ΦV1 changes from a middle level voltage $V_{VM}$ to a low level voltage $V_{VL}$.

Consequently, as shown in FIG. 7C, under the second electric charge transfer electrode 504, one step of potential level difference 214 is formed by the $n^+$ type potential level difference region 215. A minimum electric field 212 under the second electric charge transfer electrode 504 becomes larger than a minimum electric field 512 of the conventional solid-state imaging device.

Thus, in the solid-state imaging device according to Embodiment 2, even if the electrode length L1 of the second electric charge transfer electrode 504 is set to be longer than the electrode length L2 of the first electric charge transfer electrode 503 so as to reduce a read voltage, the minimum electric field 212 under the second electric charge transfer electrode 504 can be increased by forming the $n^+$ type potential level difference region 215 on a downstream side in an electric charge transfer direction of the CCD channel region 202 under the second electric charge transfer electrode 504. Therefore, both a reduction in a read voltage and enhancement of a transfer efficiency can be satisfied.

Furthermore, in the solid-state imaging device according to Embodiment 2, by forming the $n^+$ type potential level difference regions 215 in parts of the CCD channel region 202, n type impurity concentration of the $n^+$ type potential level difference region 215 is set to be higher than that of the conventional solid-state imaging device. Therefore, the maximum electric transfer charge amount of the vertical CCD can be increased.

Furthermore, according to the method for producing a solid-state imaging device according to Embodiment 2, the downstream end in an electric charge transfer direction of the $n^+$ type potential level difference region 215 can be formed in a self-alignment manner with respect to the first electric charge transfer electrode 503. Therefore, the $n^+$ type potential level difference region 215 does not come under the first electric charge transfer region 503 due to the misalignment of a mask, and a gap is not formed between the downstream end of the $n^+$ type potential level difference region 215 and the upstream end of the first electric charge transfer electrode 503 in an electric charge transfer direction. Therefore, a solid-state imaging device with a high transfer efficiency can be produced stably.

Figure 8:
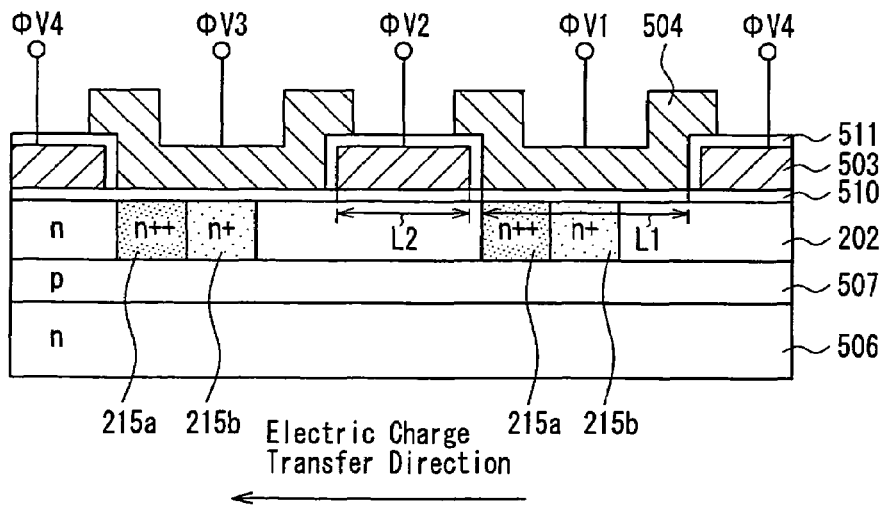
FIG. 8 is a cross-sectional view showing a modified exemplary configuration of a vertical CCD in a solid-state imaging device according to Embodiment 2 of the present invention.

In Embodiment 2, the case where one step of potential level difference is provided by forming one $n^+$ type potential level difference region 215 under each second electric charge transfer electrode 504 has been described and illustrated. However, the present invention is not limited thereto. As shown in FIG. 8 as a modified example of Embodiment 2, two or more steps of potential level differences may be formed by a method for forming an $n^{++}$ type potential level difference region 215a and an $n^+$ type potential level difference region 215b in the CCD channel region 202 under the second electric charge transfer electrode 504. This further enlarges the minimum electric field under the second electric charge transfer electrode 504. Therefore, the transfer efficiency can be enhanced further.

Embodiment 3

Figure 9A:
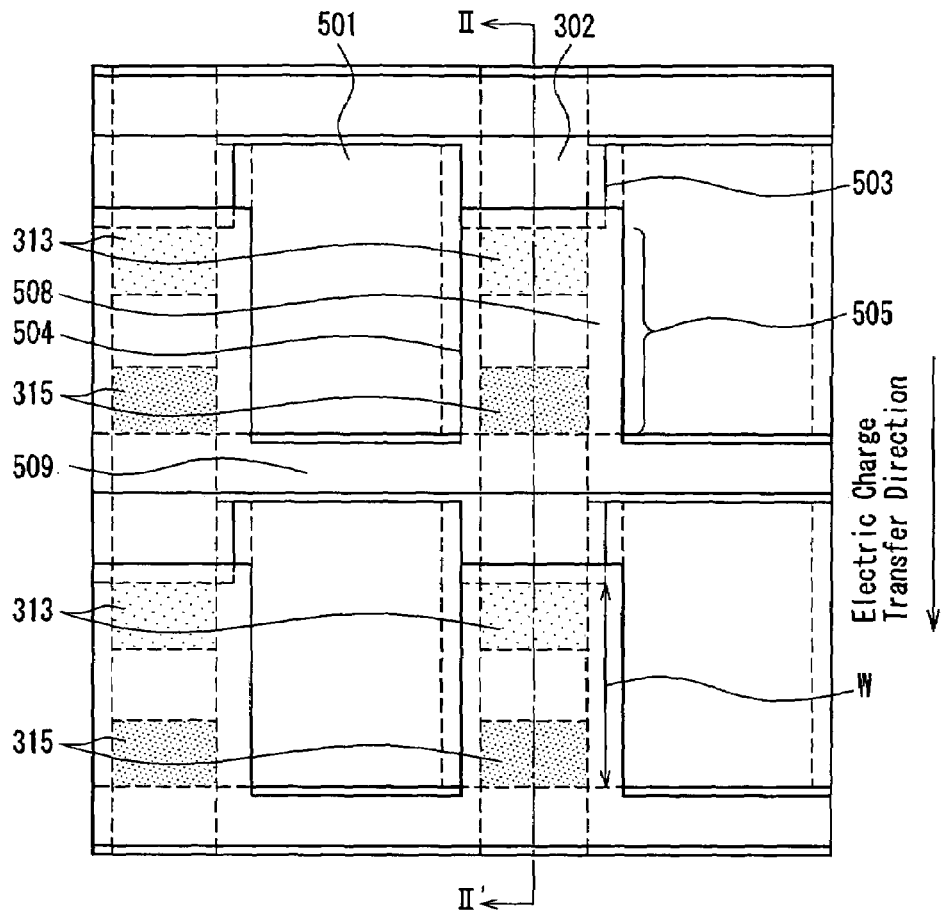
FIG. 9A is a plan view showing a pixel configuration in a solid-state imaging device according to Embodiment 3 of the present invention.
Figure 9B:
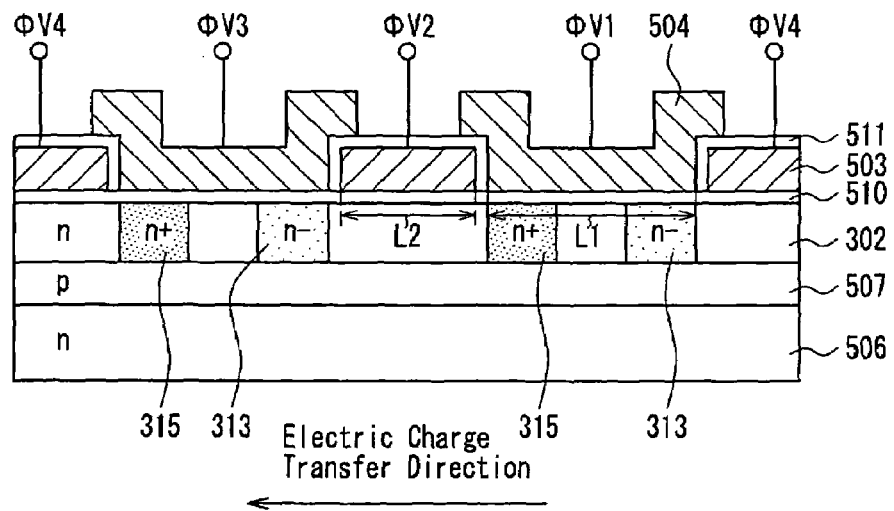
FIG. 9B is a cross-sectional view taken along a line II–II' shown in FIG. 9A.

FIG. 9A is a plan view showing a pixel configuration in a solid-state imaging device according to Embodiment 3 of the present invention. FIG. 9B is a cross-sectional view taken along a line II–II' shown in FIG. 9A.

In FIGS. 9A and 9B, Embodiment 3 is different from Embodiment 1 shown in FIGS. 1A and 1B, in that, in a CCD channel region 302 under second electric charge transfer electrodes 504, $n^-$ type potential level difference regions 313 for forming a potential gradient are provided on an upstream side in an electric charge transfer direction, and $n^+$ type potential level difference regions 315 for forming a potential gradient are provided on a downstream side in an electric charge transfer direction.

Next, a method for producing such a solid-state imaging device will be described with reference to FIGS. 10A, 10B, 10C, and 10D. FIGS. 10A to 10D are cross-sectional views in each production step for a vertical CCD shown by the cross-sectional view in FIG. 9B.

Figure 10A:
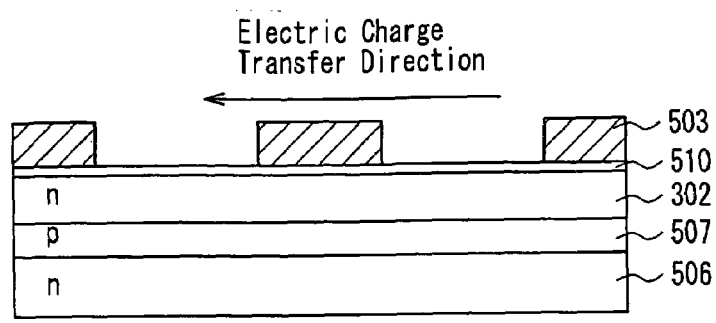
FIG. 10A is a cross-sectional view in one step of producing a vertical CCD shown by the cross-sectional view in FIG. 9B.

First, as shown in FIG. 10A, a p type well 507 is formed by implanting a p type impurity into an n type semiconductor substrate 506. A CCD channel region 302 is formed by implanting an n type impurity into a surface region of the p type well 507. A gate insulating film 510 is formed by growing a thermal oxide film and a CVD nitride film on a surface of the CCD channel region 302. First electric charge transfer electrodes 503 are provided by forming a first polysilicon layer on the gate insulating film 510, and removing the first polysilicon layer by patterning.

Figure 10B:
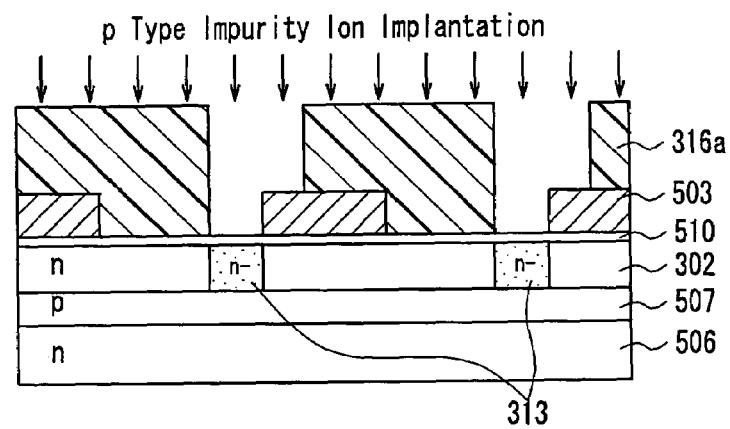
FIG. 10B is a cross-sectional view in one step of producing the vertical CCD shown by the cross-sectional view in FIG. 9B.

Next, as shown in FIG. 10B, a photoresist 316a having openings on an upstream side in an electric charge transfer direction of the first electric charge transfer electrodes 503 is formed. Using the photoresist 316a and the first electric charge transfer electrodes 503 as a mask, a p type impurity such as boron is implanted in a self-alignment manner, whereby n$^-$ type potential level difference regions 313 are formed.

Figure 10C:
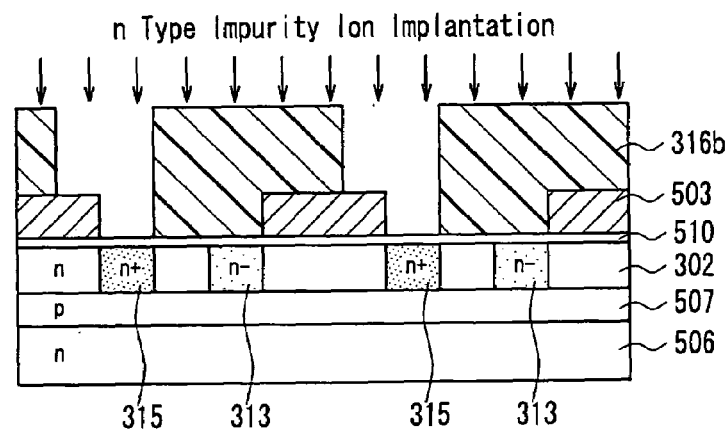
FIG. 10C is a cross-sectional view in one step of producing the vertical CCD shown by the cross-sectional view in FIG. 9B.

Next, as shown in FIG. 10C, a photoresist 316b having openings on a downstream side in an electric charge transfer direction of the first electric charge transfer electrodes 503 is formed. Using the photoresist 316b and the first electric charge transfer electrodes 503 as a mask, a n type impurity such as boron and arsenic is implanted in a self-alignment manner, whereby n$^+$ type potential level difference regions 315 are formed.

Figure 10D:
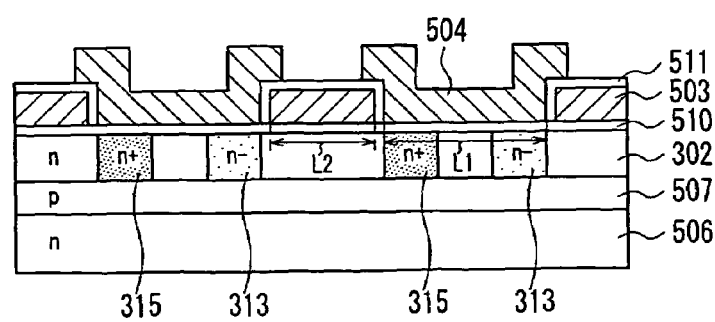
FIG. 10D is a cross-sectional view in one step of producing the vertical CCD shown by the cross-sectional view in FIG. 9B.

Next, as shown in FIG. 10D, the circumferences of the first electric charge transfer electrodes 503 are thermally oxidized to form an interlayer insulating film 511. Then, second electric charge transfer electrodes 504 composed of a second polysilicon layer are formed between the first electric charge transfer electrodes 503 on the gate insulating film 510, whereby a solid-state imaging device according to Embodiment 3 is produced.

Next, the advantages of the solid-state imaging device thus produced will be described with reference to FIGS. 11A, 11B, and 11C.

Figure 11A:
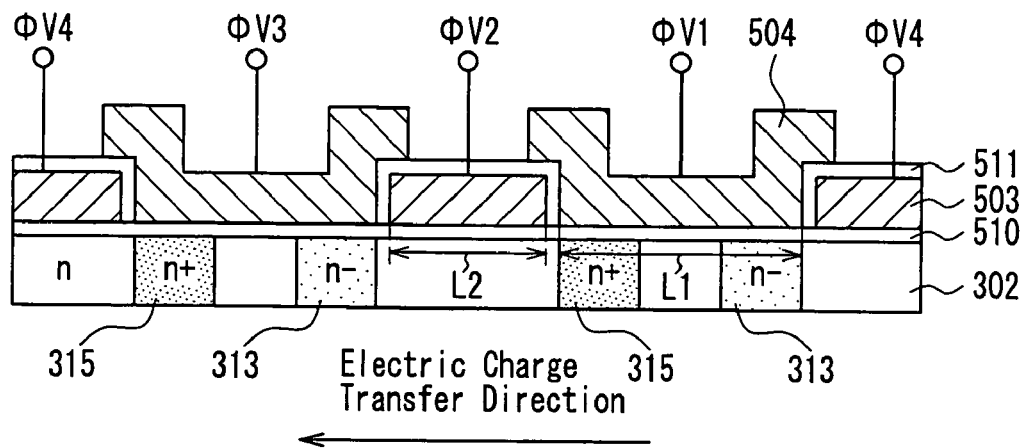
FIG. 11A is a cross-sectional view partially showing the vertical CCD shown in FIG. 9B or 10D.
Figure 11B:
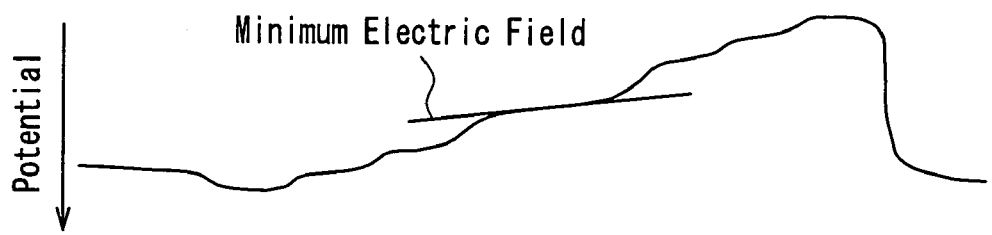
FIG. 11B shows a potential distribution in a channel region at an intermediate voltage while the vertical CCD shown in FIG. 11A is driven with four-phase transfer docks of ΦV1, ΦV2, ΦV3, and ΦV4, whereby a first electric charge transfer electrode 503 supplied with ΦV2 changes from a middle level voltage $V_{VM}$ to a low level voltage $V_{VL}$.

FIG. 11A is a cross-sectional view partially showing the vertical CCD shown in FIG. 9B or 10D. FIG. 11B shows a potential distribution in a channel region at an intermediate voltage while the vertical CCD shown in FIG. 1A is driven with four-phase transfer docks of $\Phi V1$, $\Phi V2$, $\Phi V3$, and $\Phi V4$, whereby the first electric charge transfer electrode 503 supplied with $\Phi V2$ changes from a middle level voltage $V_{VM}$ to a low level voltage $V_{VL}$. FIG. 11C shows a potential distribution in a channel region at an intermediate voltage the second electric charge transfer electrode 504 supplied with $\Phi V1$ changes from a middle level voltage $V_{VM}$ to a low level voltage $V_{VL}$. In FIGS. 11B and 11C, a potential is shown with the downward direction being positive.

As described above, generally, the transfer efficiency of a CCD is determined mainly by a fringe electric field generated between transfer electrodes. In particular, the transfer efficiency largely depends upon a minimum electric field under a transfer electrode. As the minimum electric field is larger, a time (transfer time) required for transfer becomes shorter, whereby the transfer efficiency is enhanced.

As shown in FIG. 11A, in the solid-state imaging device according to Embodiment 3, in order to reduce a read voltage, an electrode length L1 of the second electric charge transfer electrode 504 is set to be longer than an electrode length L2 of the first electric charge transfer electrode 503.

At the same time, the n$^-$ type potential level difference region 313 for forming a potential gradient is provided on an upstream side in an electric charge transfer direction in the CCD channel region 302 under each second electric charge transfer electrode 304, and the n$^+$ type potential level difference region 315 for forming a potential gradient is provided on a downstream side in an electric charge transfer direction.

Figure 11C:
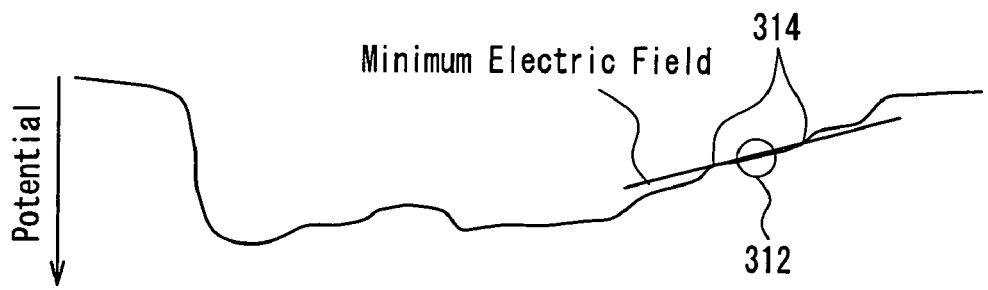
FIG. 11C shows a potential distribution in a channel region at an intermediate voltage while the vertical CCD shown in FIG. 11A is driven with four-phase transfer docks of ΦV1, ΦV2, ΦV3, and ΦV4, whereby a second electric charge transfer electrode 504 supplied with ΦV1 changes from a middle level voltage $V_{VM}$ to a low level voltage $V_{VL}$.

Consequently, as shown in FIG. 11C, under the second electric charge transfer electrode 504, two steps of potential level differences 314 are formed by the n$^-$ type potential level difference region 313 and the n$^+$ type potential level difference region 315 under the second electric charge transfer electrode 504. A minimum electric field 312 under the second electric charge transfer electrode 504 becomes larger than minimum electric fields of the solid-state imaging devices according to Embodiments 1 and 2.

Thus, in the solid-state imaging device according to Embodiment 3, even if the electrode length L1 of the second electric charge transfer electrode 504 is set to be longer than the electrode length L2 of the first electric charge transfer electrode 503 so as to reduce a read voltage, the minimum electric field 312 under the second electric charge transfer electrode 504 can be increased further by forming the n$^-$ type potential level difference region 313 on an upstream side in an electric charge transfer direction, and by forming the n$^+$ type potential level difference region 315 on a downstream side in an electric charge transfer direction, in the CCD channel region 302 under the second electric charge transfer electrode 504. Therefore, both a reduction in a read voltage and enhancement of a transfer efficiency can be satisfied.

Furthermore, according to the method for producing a solid-state imaging device according to Embodiment 3, the upstream end in an electric charge transfer direction of the n$^-$ type potential level difference region 313 and the downstream end in an electric charge transfer direction of the n$^+$ type potential level difference region 315 are formed in a self-alignment manner with respect to the first electric charge transfer electrode 503. Therefore, the n$^-$ type potential level difference region 313 and the n$^+$ type potential level difference region 315 do not come under the first electric charge transfer region 503 due to the misalignment of a mask, and a gap is not formed between the upstream end of the n$^-$ type potential level difference region 313 and the first electric charge transfer electrode 503, and between the downstream end of the n$^+$ type potential level difference region 315 and the first electric charge transfer electrode 503. Therefore, a solid-state imaging device with a high transfer efficiency can be produced stably.

Figure 12A:
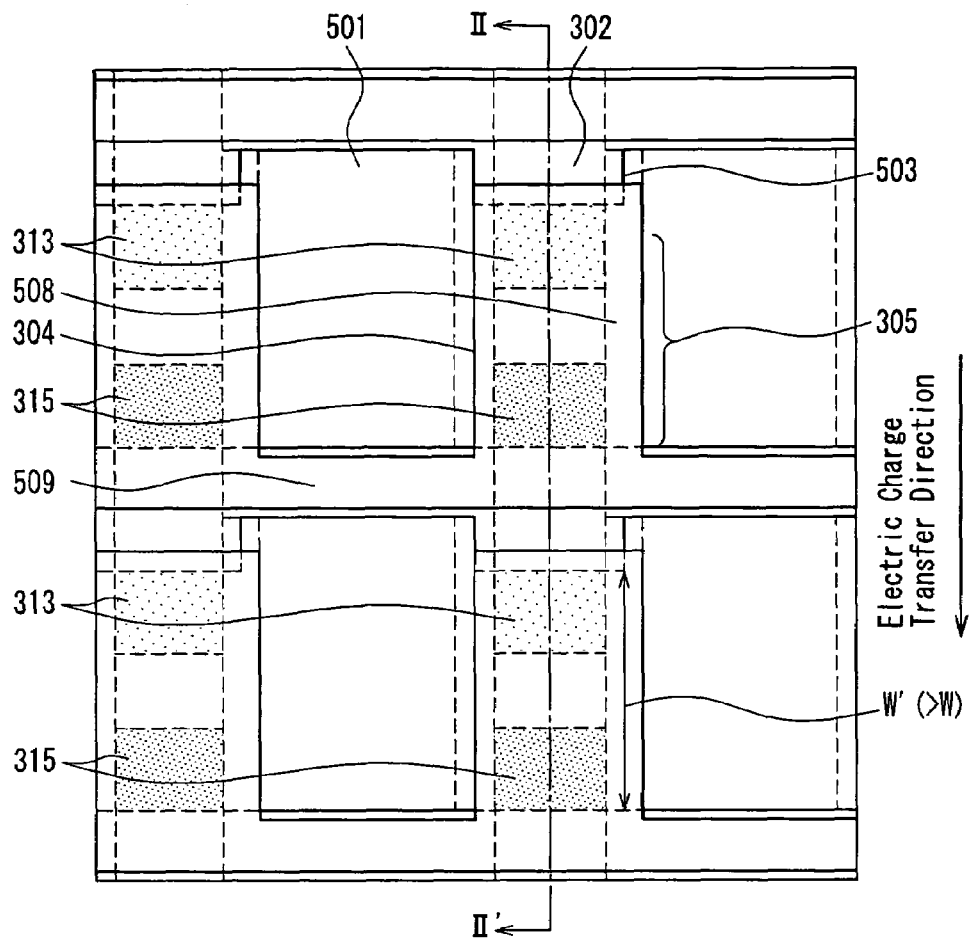
FIG. 12A is a plan view showing a modified example of a pixel configuration in a solid-state imaging device according to Embodiment 3 of the present invention.
Figure 12B:
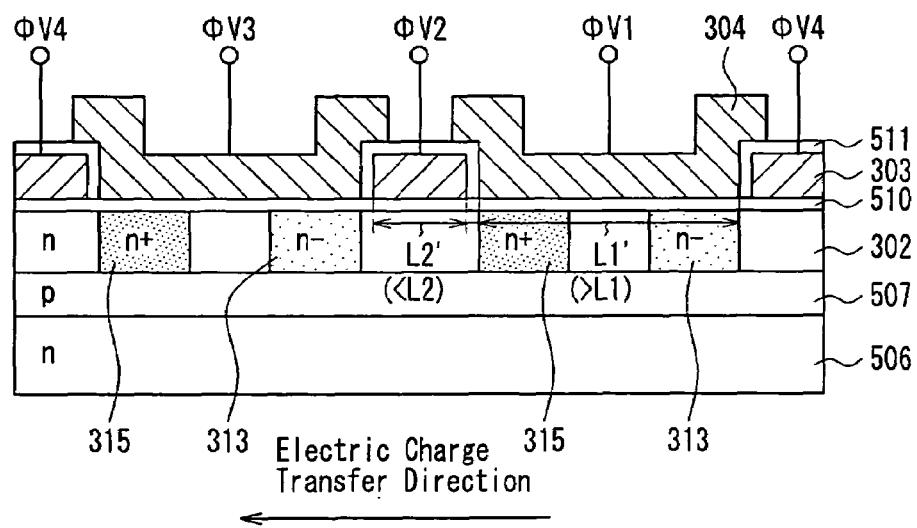
FIG. 12B is a cross-sectional view taken along a line II–II' shown in FIG. 12A.

As a modified example of Embodiment 3, as shown by the plan view in FIG. 12A and the cross-sectional view in FIG. 12B, by setting an electrode length L2' of the first electric charge transfer electrode 303 to be shorter than that of the solid-state imaging devices of Embodiments 1 and 2 (L2'<L2), and by setting an electrode length L1' of the second charge transfer electrode 304 to be longer than that of the solid-state imaging devices of Embodiments 1 and 2 (L1'>L1), a width W' (FIG. 12A) of the charge read portion 305 can be formed wide (W'>W). Therefore, while a high transfer efficiency is maintained, a read voltage can be reduced further, compared with the solid-state imaging devices according to Embodiments 1 and 2.

Embodiment 4

Figure 13A:
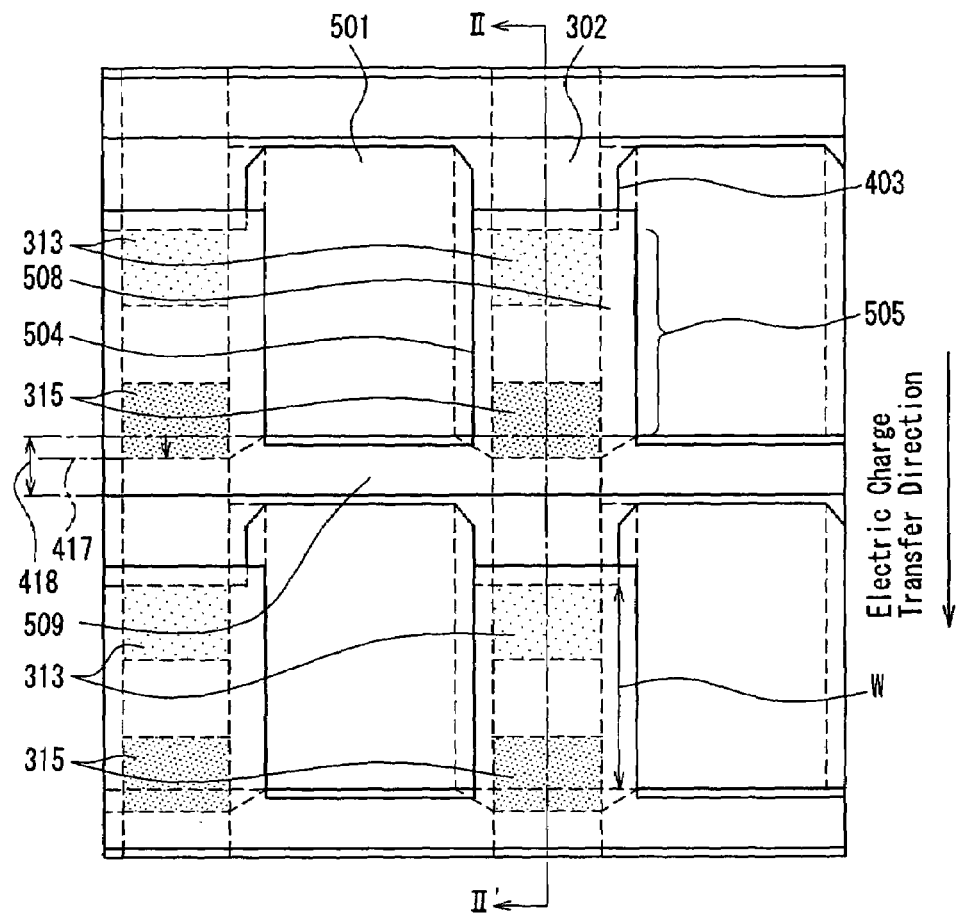
FIG. 13A is a plan view showing a pixel configuration in a solid-state imaging device according to Embodiment 4 of the present invention.
Figure 13B:
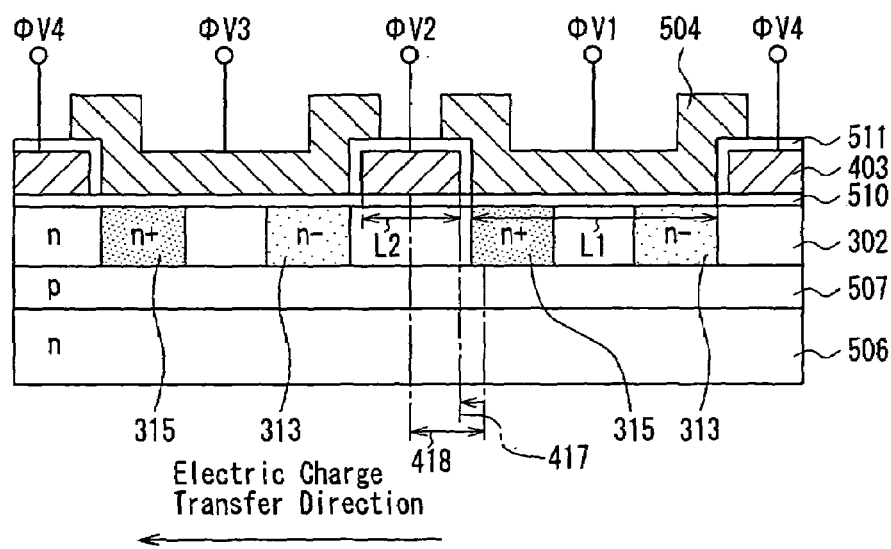
FIG. 13B is a cross-sectional view taken along a line II–II' shown in FIG. 13A.

FIG. 13A is a plan view showing a pixel configuration in a solid-state imaging device according to Embodiment 4 of the present invention. FIG. 13B is a cross-sectional view taken along a line II–II' shown in FIG. 13A.

In FIGS. 13A and 13B, Embodiment 4 is different from Embodiment 3 shown in FIGS. 9A and 9B, in that an upstream side portion 417 in an electric charge transfer direction of the first electric charge transfer electrode 403 on the CCD channel region 302 is positioned in a gap 418 between photoelectric converting regions adjacent to each other in an electric charge transfer direction. The other portions are the same as those of Embodiment 3, so that they are denoted with the same reference numerals as those in Embodiment 3, and their description will be omitted here.

Next, the advantages of such a solid-state imaging device will be described with reference to FIGS. 14A, 14B, and 14C.

Figure 14A:
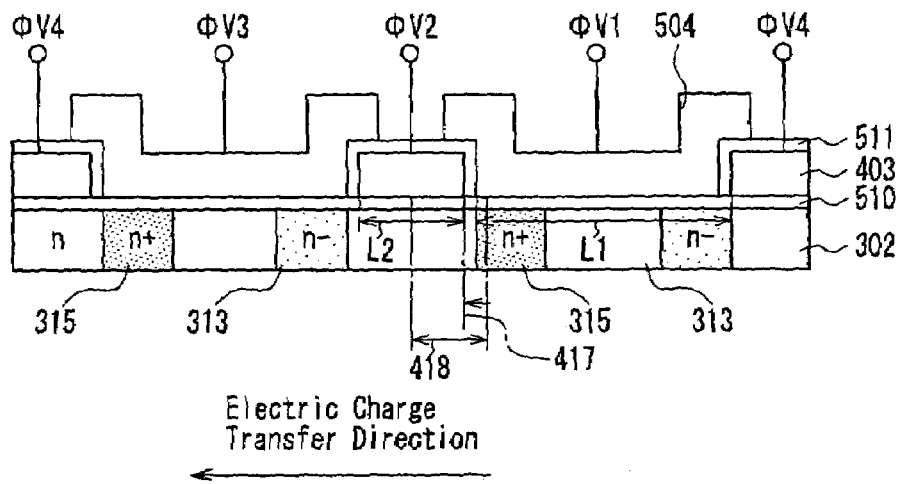
FIG. 14A is a cross-sectional view partially showing a vertical CCD shown in FIG. 13B.

FIG. 14A is a cross-sectional view partially showing the vertical CCD shown in FIG. 13B. FIG. 14B shows a potential distribution in a channel region at an intermediate voltage while the vertical CCD shown in FIG. 14A is driven with four-phase transfer clocks of ΦV1, ΦV2, ΦV3, and ΦV4, whereby the first electric charge transfer electrode 403 supplied with ΦV2 changes from a middle level voltage $V_{VM}$ to a low level voltage $V_{VL}$. FIG. 14C shows a potential distribution in a channel region at an intermediate voltage while the second electric charge transfer electrode 504 supplied with ΦV1 changes from a middle level voltage $V_{VM}$ to a low level voltage $V_{VL}$. In FIGS. 14B and 14C, a potential is shown with the downward direction being positive.

As described above, generally, the transfer efficiency of a CCD is determined mainly by a fringe electric field generated between transfer electrodes. In particular, the transfer efficiency largely depends upon a minimum electric field under a transfer electrode. As the minimum electric field is larger, a time (transfer time) required for transfer becomes shorter, whereby the transfer efficiency is enhanced.

As shown in FIG. 14A, in the solid-state imaging device according to Embodiment 4, in order to reduce a read voltage, an electrode length L1 of the second electric charge transfer electrode 504 is set to be longer than an electrode length L2 of the first electric charge transfer electrode 403. At the same time, in the CCD channel region 302 under the second electric charge transfer electrode 504, the n⁻ type potential level difference region 313 for forming a potential gradient is provided on an upstream side in an electric charge transfer direction, and the n⁺ type potential level difference region 315 for forming a potential gradient is formed on a downstream side in an electric charge transfer direction.

Figure 14B:
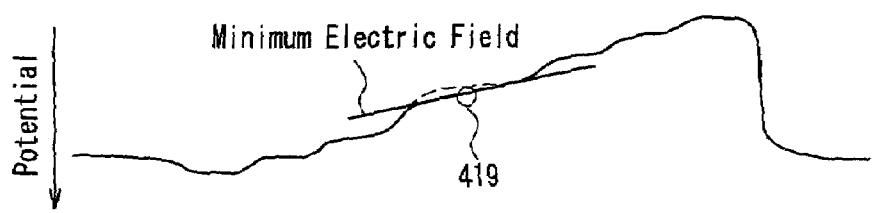
FIG. 14B shows a potential distribution in a channel region at an intermediate voltage while the vertical CCD shown in FIG. 14A is driven with four-phase transfer clocks of ΦV1, ΦV2, ΦV3, and ΦV4, whereby a first electric charge transfer electrode 403 supplied with ΦV2 changes from a middle level voltage $V_{VM}$ to a low level voltage $V_{VL}$.
Figure 14C:
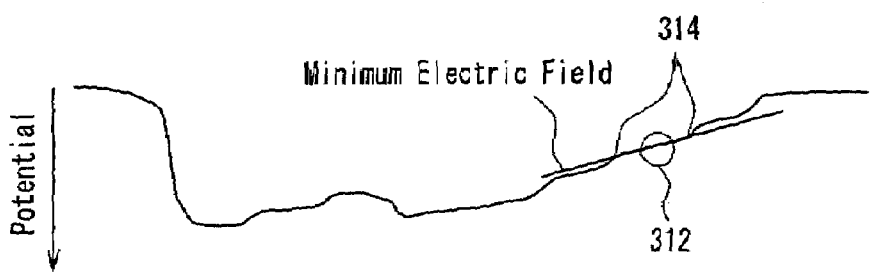
FIG. 14C shows a potential distribution in a channel region at an intermediate voltage while the vertical CCD shown in FIG. 14A is driven with four-phase transfer clocks of ΦV1, ΦV2, ΦV3, and ΦV4, whereby a second electric charge transfer electrode 504 supplied with ΦV1 changes from a middle level voltage $V_{VM}$ to a low level voltage $V_{VL}$.

Consequently, as shown in FIG. 14C, under the second electric charge transfer electrode 504, two steps of potential level differences 314 are formed by the n⁻ type potential level difference region 313 and the n⁺ type potential level difference region 315. A minimum electric field 312 under the second electric charge transfer electrode 504 becomes large in the same way as in Embodiment 3.

Furthermore, in the solid-state imaging device according to Embodiment 4, as shown in FIG. 14A, the upstream side portion 417 in an electric charge transfer direction of the first electric charge transfer electrode 403 on the CCD channel region 302 is positioned in the gap 418 between the photoelectric converting regions adjacent to each other in an electric charge transfer direction. More specifically, the solid-state imaging device according to Embodiment 4 is configured in such a manner that only the upstream side portion 417 in an electric charge transfer direction in the CCD channel region 302 under the first electric charge transfer electrode 403 is interposed by the p⁺ type device separation region 509.

Consequently, as shown in FIG. 14B, the narrow channel effect of the p⁺ type device separation region 509 contributes to only the upstream side portion. Therefore, a potential gradient is formed in the CCD channel region under the first electric charge transfer electrodes 403, in the same way as in the second electric charge transfer electrodes 504. Furthermore, a minimum electric field 419 under the first electric charge transfer electrode 403 becomes larger than those of the conventional example and the solid-state imaging devices of Embodiments 1 to 3.

Thus, in the solid-state imaging device according to Embodiment 4, even if the electrode length L1 of the second electric charge transfer electrode 504 is set to be longer than the electrode length L2 of the first electric charge transfer electrode 403 so as to reduce a read voltage, the minimum electric field 312 under the second electric charge transfer electrode 504 can be increased by forming the n⁻ type potential level difference region 413 and the n⁺ type potential level difference region 415 in the CCD channel region 302 under the second electric charge transfer electrode 504. Therefore, both a reduction in a read voltage and enhancement of a transfer efficiency can be satisfied.

Furthermore, the upstream side portion 417 in an electric charge transfer direction of the first electric charge transfer electrode 403 on the CCD channel region 302 is positioned in the gap 418 between the photoelectric converting regions adjacent to each other in an electric charge transfer direction. Therefore, the minimum electric field 419 under the first charge transfer electrode 403 can be increased, which further enhances the transfer efficiency of electric charge in this portion.

Figure 15A:
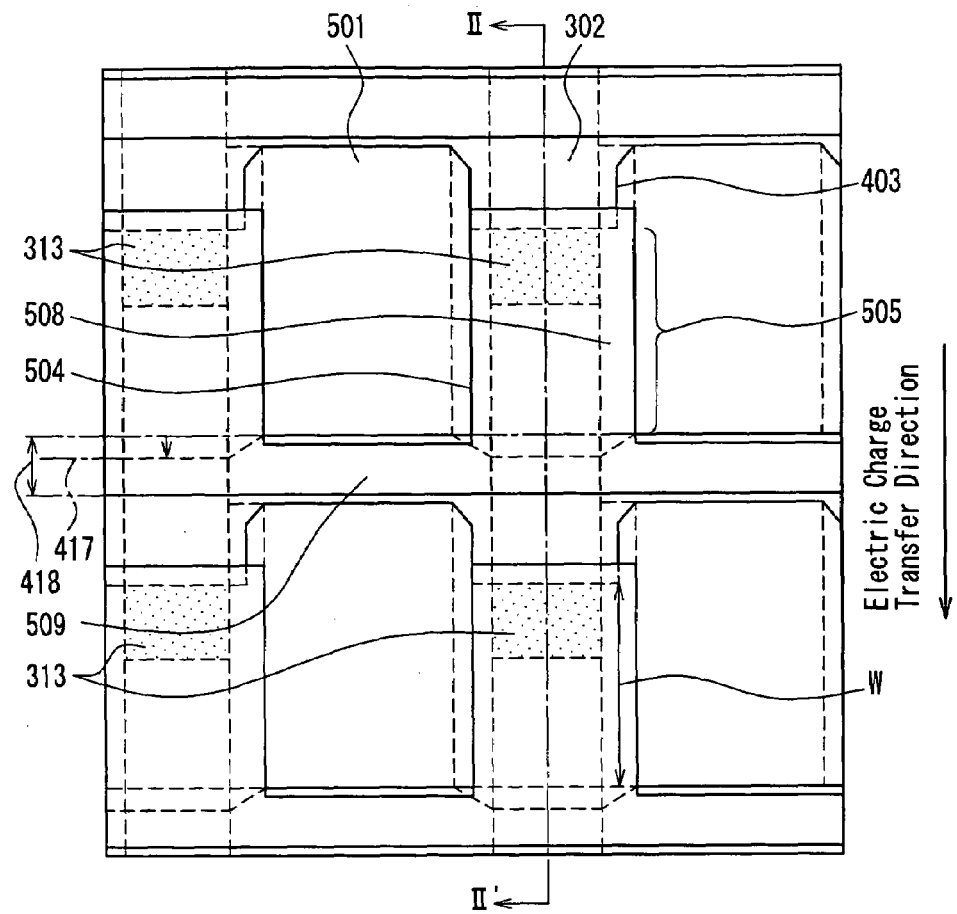
FIG. 15A is a plan view showing a modified example of a pixel configuration in a solid-state imaging device according to Embodiment 4 of the present invention.
Figure 15B:
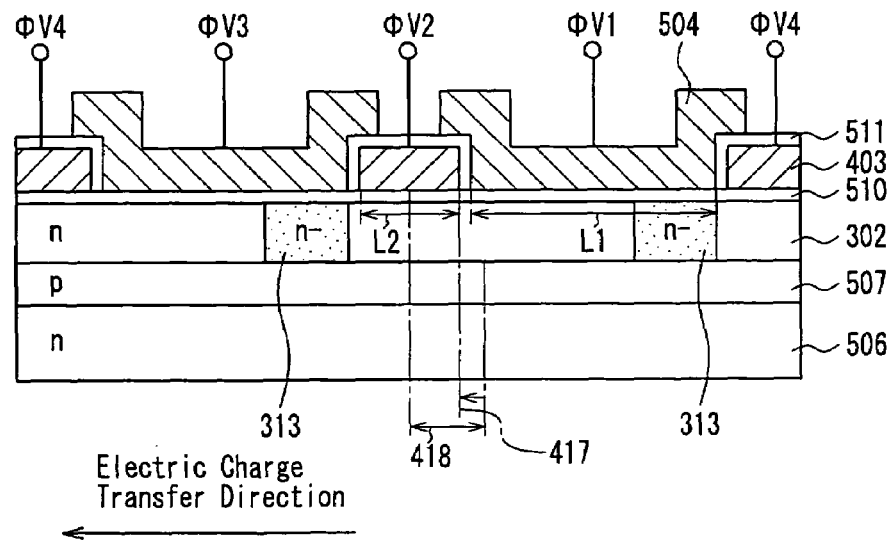
FIG. 15B is a cross-sectional view taken along a line II–II' shown in FIG. 15A.
Figure 16A:
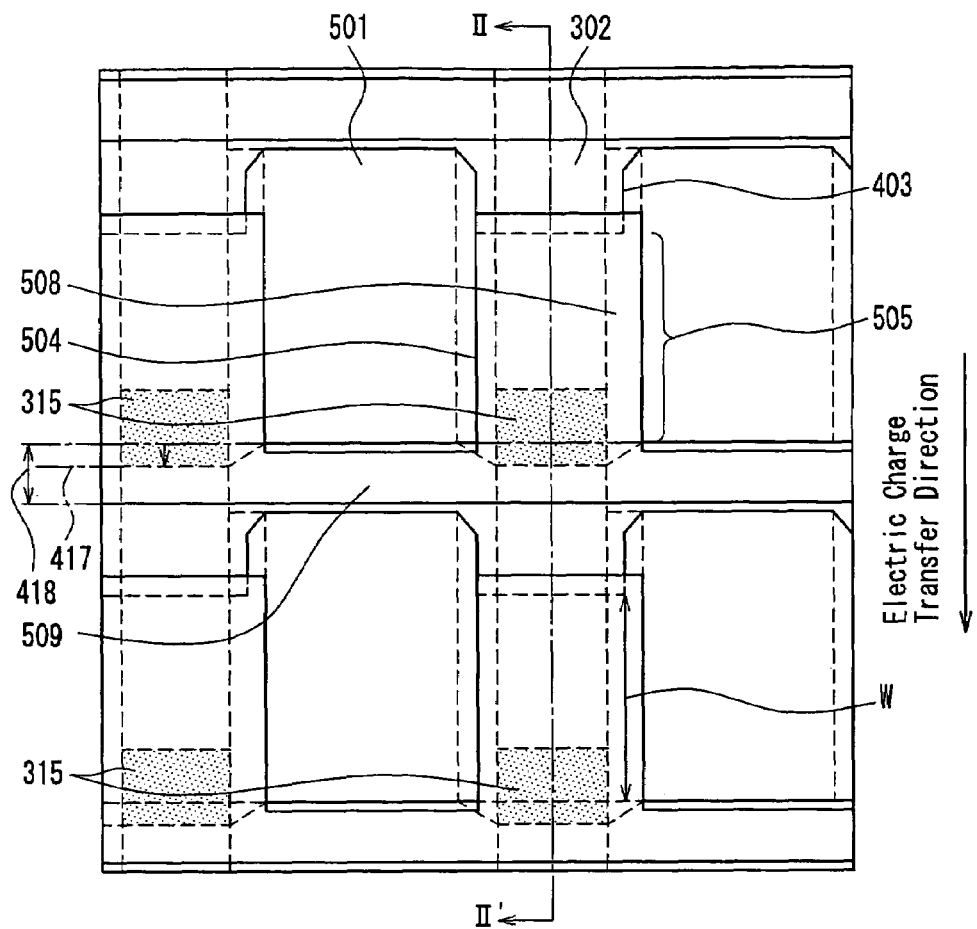
FIG. 16A is a plan view showing another modified example of the pixel configuration in the solid-state imaging device according to Embodiment 4 of the present invention.
Figure 16B:
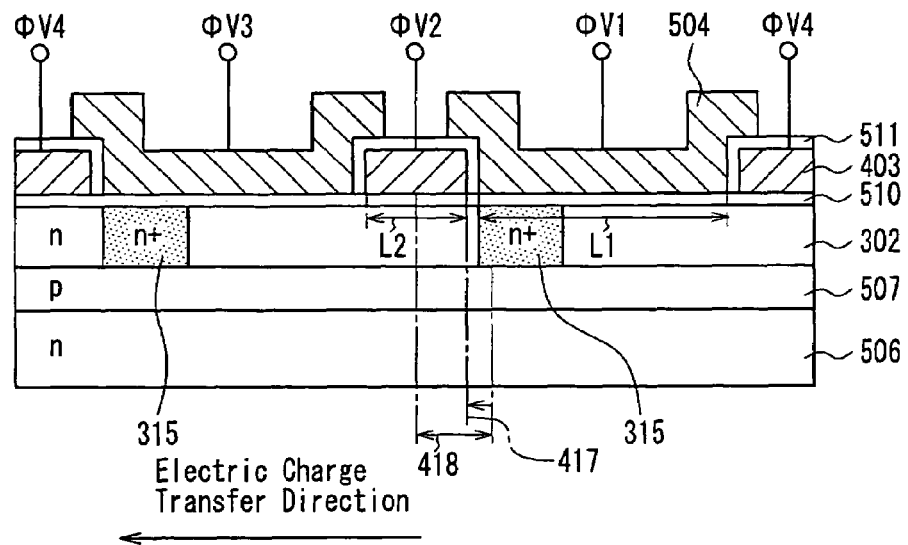
FIG. 16B is a cross-sectional view taken along a line II–II' shown in FIG. 16A.

In Embodiment 4, in the same way as in Embodiment 3, the case has been described and illustrated, where both the n⁻ type potential level difference regions 313 and the n⁺ type potential level difference regions 315 are formed under the second electric charge transfer electrodes 504. However, as shown in FIGS. 15A and 15B, only the n⁻ type potential level difference regions 313 may be formed, or as shown in FIGS. 16A and 16B, only the n⁺ type potential level difference regions 315 may be formed. In either configuration, the transfer efficiency of electric charge under the first electric charge transfer electrode 403 can be enhanced in the same way.

As described above, in the solid-state imaging device in which either one of the n⁻ type potential level difference region 313 and the n⁺ type potential level difference region 315 is formed, unlike the solid-state imaging device in which both the n⁻ type potential level difference region 313 and the n⁺ type potential level difference region 315 are formed as shown in FIGS. 13A and 13B, a lithography step and an ion implantation step for forming a potential level difference region can be omitted, which can shorten the production time and reduce the production cost.

Each embodiment has been described by way of preferable examples. However, the present invention is not limited to these embodiments, and may be varied variously in a scope without departing from the spirit of the present invention. For example, in Embodiments 1 to 4, the interline transfer type solid-state imaging device of an interlace system, in which two electric charge transfer electrodes constitute one pixel, has been descried. The present invention also is applicable to an interline transfer type solid-state imaging device of a progressive system, in which three or more electric charge transfer electrodes constitute one pixel.

In each of the above embodiments, the case where the first electric charge transfer electrode is formed of a first polysilicon layer, and the second electric charge transfer electrode is formed of a second polysilicon layer has been described and illustrated. The present invention also is applicable to a solid-state imaging device with a single-layer electrode configuration in which the first electric charge transfer electrode and the second electric charge transfer electrode respectively are formed of one polysilicon film.

The electric charge transfer electrode in each embodiment may be formed of a silicide film, a polycide film, or other conductive electrode films, instead of a polysilicon film.

As described above, according to the present invention, in order to reduce a read voltage, by setting the electrode length of the second electric charge transfer electrode to be longer than that of the first electric charge transfer electrode, and simultaneously by forming either one or both of the $n^-$ type potential level difference region and the $n^+$ type potential level difference region in the CCD channel region under the second electric charge transfer electrode, the minimum electric field under the second electric charge transfer electrode can be increased. Consequently, both a reduction in a read voltage and enhancement of a transfer efficiency can be satisfied.

Furthermore, by positioning the upstream side portion in an electric charge transfer direction of the first electric charge transfer electrode on the CCD channel region in a gap between the photoelectric converting regions adjacent to each other in an electric charge transfer direction, the minimum electric field under the first electric charge transfer electrode also can be increased, which can enhance the transfer efficiency under this electrode.

Consequently, the present invention has a special effect of providing a solid-state imaging device with low power consumption, high-speed driving, and high image quality.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device, comprising:
   a plurality of second conductivity photoelectric converting regions formed on a surface region of a first conductivity semiconductor substrate or a first conductivity well;
   a second conductivity CCD channel region provided adjacent to the photoelectric converting regions;
   a first conductivity electric charge reading region provided between the photoelectric converting region and the CCD channel region;
   a first conductivity device separation region provided on circumferences of the photoelectric converting regions excluding the reading region;
   a plurality of first electric charge transfer electrodes provided on the CCD channel region; and
   second electric charge transfer electrodes provided between the plurality of first electric charge transfer electrodes,
   wherein the second electric charge transfer electrodes have an electrode length in an electric charge transfer direction longer than that of the first electric charge transfer electrodes, and function as an electric charge reading gate for reading electric charge from the photoelectric converting regions, and in the CCD channel region under the second electric charge transfer electrodes, a potential gradient deepening in the electric charge transfer direction is provided.

2. The solid-state imaging device according to claim 1, wherein a first conductivity impurity is implanted into an upstream side portion in the electric charge transfer direction of the second conductivity CCD channel region under the second electric charge transfer electrodes, whereby at least one step of potential level difference is provided.

3. The solid-state imaging device according to claim 2, wherein the first electric charge transfer electrodes are formed of a first electrode film layer, and one end of a region where the first conductivity impurity is implanted is formed in a self-alignment manner with respect to an end of the first electric charge transfer electrode.

4. The solid-state imaging device according to claim 1, wherein a second conductivity impurity is implanted into a downstream side portion in the electric charge transfer direction of the second conductivity CCD channel region under the second electric charge transfer electrodes, whereby at least one step of potential level difference is provided.

5. The solid-state imaging device according to claim 4, wherein the first electric charge transfer electrodes are formed of a first electrode film layer, and one end of a region where the second conductivity impurity is implanted is formed in a self-alignment manner with respect to an end of the first electric charge transfer electrode.

6. The solid-state imaging device according to claim 1, wherein in the second conductivity CCD channel region under the second electric charge transfer electrodes, a first conductivity impurity is implanted into an upstream side portion in the electric charge transfer direction, and a second conductivity impurity is implanted into a downstream side portion in the electric charge transfer direction, whereby at least two steps of potential level differences are provided.

7. The solid-state imaging device according to claim 6, wherein the first electric charge transfer electrodes are formed of a first electrode film layer, and one end of a region where the first conductivity impurity and the second conductivity impurity are implanted is formed in a self-alignment manner with respect to an end of the first electric charge transfer electrode.

8. The solid-state imaging device according to claim 1, wherein an upstream side portion in the electric charge transfer direction of the first electric charge transfer electrodes on the CCD channel region is positioned in a gap between the photoelectric converting regions adjacent to each other in the electric charge transfer direction.

* * * * *